United States Patent
Keller et al.

(10) Patent No.: US 6,772,827 B2
(45) Date of Patent: Aug. 10, 2004

(54) SUSPENDED GAS DISTRIBUTION MANIFOLD FOR PLASMA CHAMBER

(75) Inventors: Ernst Keller, Sunnyvale, CA (US); Quanyuan Shang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 124 days.

(21) Appl. No.: 09/922,219

(22) Filed: Aug. 3, 2001

(65) Prior Publication Data

US 2002/0069968 A1 Jun. 13, 2002

Related U.S. Application Data

(63) Continuation-in-part of application No. 09/488,612, filed on Jan. 20, 2000, now Pat. No. 6,477,980.

(51) Int. Cl.[7] .............................. F24H 9/06; F24H 3/00
(52) U.S. Cl. ............................ 165/53; 165/47; 165/9.3; 165/9.1; 374/6; 29/525.02; 118/715; 118/728; 156/345.29; 156/345.33; 156/345.34
(58) Field of Search .......................... 165/47, 53, 9.3, 165/9.1; 29/525.02; 374/6; 118/715, 728, 50; 156/345.29, 345.33, 345.34, 345.35

(56) References Cited

U.S. PATENT DOCUMENTS

| | | | |
|---|---|---|---|
| 4,854,263 A | 8/1989 | Chang et al. ................ 118/715 |
| 5,439,524 A | 8/1995 | Cain ....................... 118/723 E |
| 5,567,243 A | * 10/1996 | Foster et al. ................. 118/730 |
| 5,582,866 A | 12/1996 | White ...................... 427/248.1 |
| 5,614,026 A | 3/1997 | Williams ............. 118/723 ME |
| 5,628,829 A | * 5/1997 | Foster et al. ............. 118/723 E |
| 5,647,911 A | * 7/1997 | Vanell et al. ................ 118/715 |
| 5,844,205 A | 12/1998 | White et al. ................. 219/390 |
| 5,846,332 A | 12/1998 | Zhao ........................... 118/728 |
| 5,882,411 A | 3/1999 | Zhao ........................... 118/715 |
| 5,968,276 A | 10/1999 | Lei .......................... 118/723 R |
| 5,994,678 A | * 11/1999 | Zhao et al. .................. 219/530 |
| 5,997,649 A | 12/1999 | Hillman ...................... 118/715 |
| 6,079,356 A | 6/2000 | Umatoy ................. 118/723 E |
| 6,123,775 A | 9/2000 | Hao ............................ 118/724 |
| 6,170,432 B1 | * 1/2001 | Szapucki et al. ......... 118/723 E |
| 6,197,151 B1 | 3/2001 | Kaji ....................... 156/345.46 |
| 6,254,742 B1 | * 7/2001 | Hanson et al. .............. 204/279 |
| 6,302,057 B1 | * 10/2001 | Leusink et al. .......... 118/723 E |
| 6,364,949 B1 | * 4/2002 | Or et al. ........................ 118/69 |
| 6,477,980 B1 | * 11/2002 | White et al. ............. 118/723 E |
| 6,527,908 B2 | * 3/2003 | Kanetsuki et al. ..... 156/345.41 |

FOREIGN PATENT DOCUMENTS

| | | |
|---|---|---|
| EP | 0 843 348 A2 | 5/1998 |
| JP | 63-187619 A | 8/1988 |
| WO | WO 95/33866 A1 | 12/1995 |
| WO | WO 99/25012 A1 | 5/1999 |
| WO | WO 99/25895 A1 | 5/1999 |

OTHER PUBLICATIONS

European search report mailed Aug. 31, 2001 for EP application No. 01300380.
European search report mailed May 23, 2001 for EP application No. 01300380.
Singapore search report mailed Feb. 14, 2002 for Singapore application No. SG 200100299–7.

* cited by examiner

Primary Examiner—Jeffrie R Lund
Assistant Examiner—Rudy Zervigon
(74) Attorney, Agent, or Firm—Robert J. Stern

(57) ABSTRACT

A gas inlet manifold for a plasma chamber having a perforated gas distribution plate suspended by a side wall comprising one or more sheets. The sheets preferably provide flexibility to alleviate stress in the gas distribution plate due to thermal expansion and contraction. In another aspect, the side wall provides thermal isolation between the gas distribution plate and other components of the chamber.

24 Claims, 16 Drawing Sheets

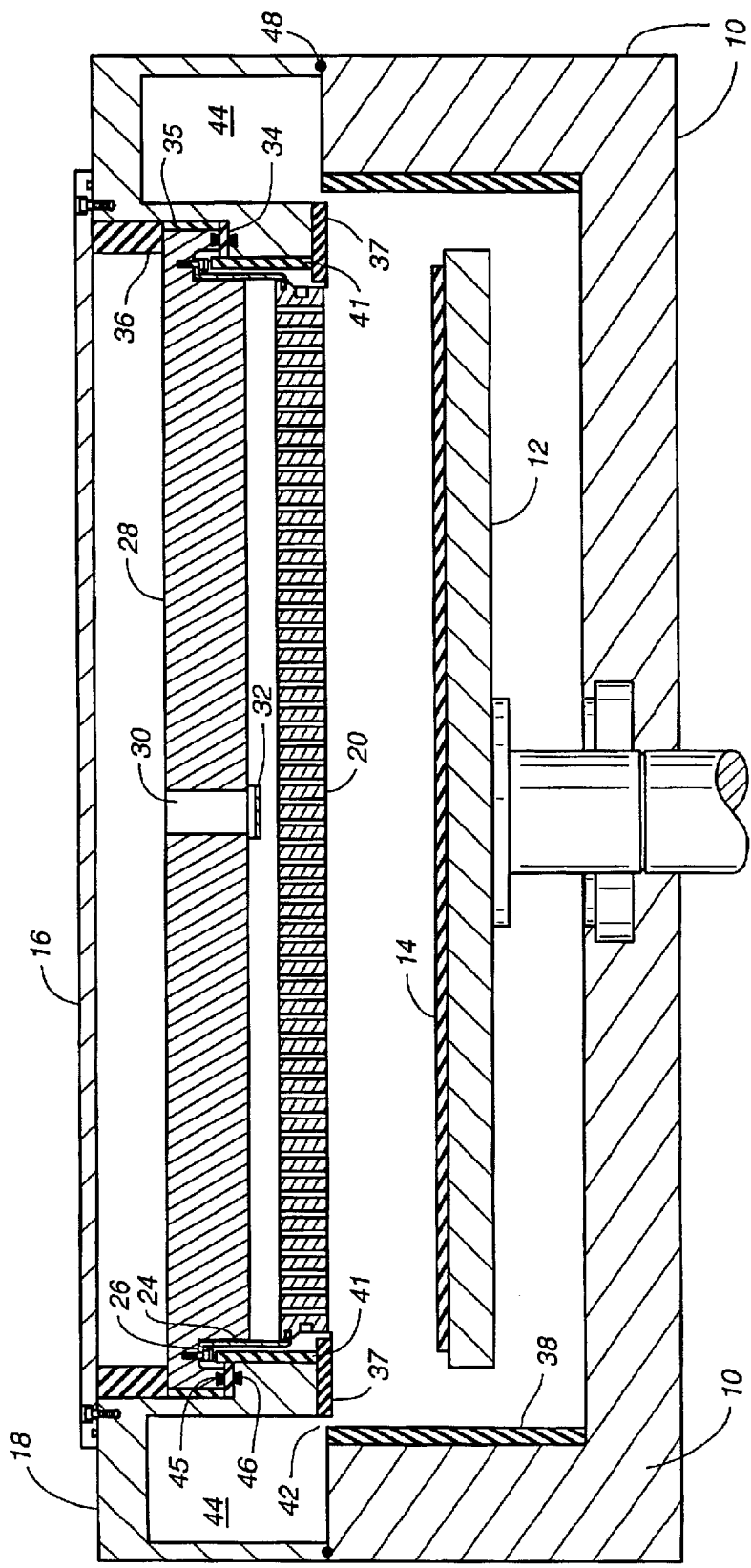
FIG._1

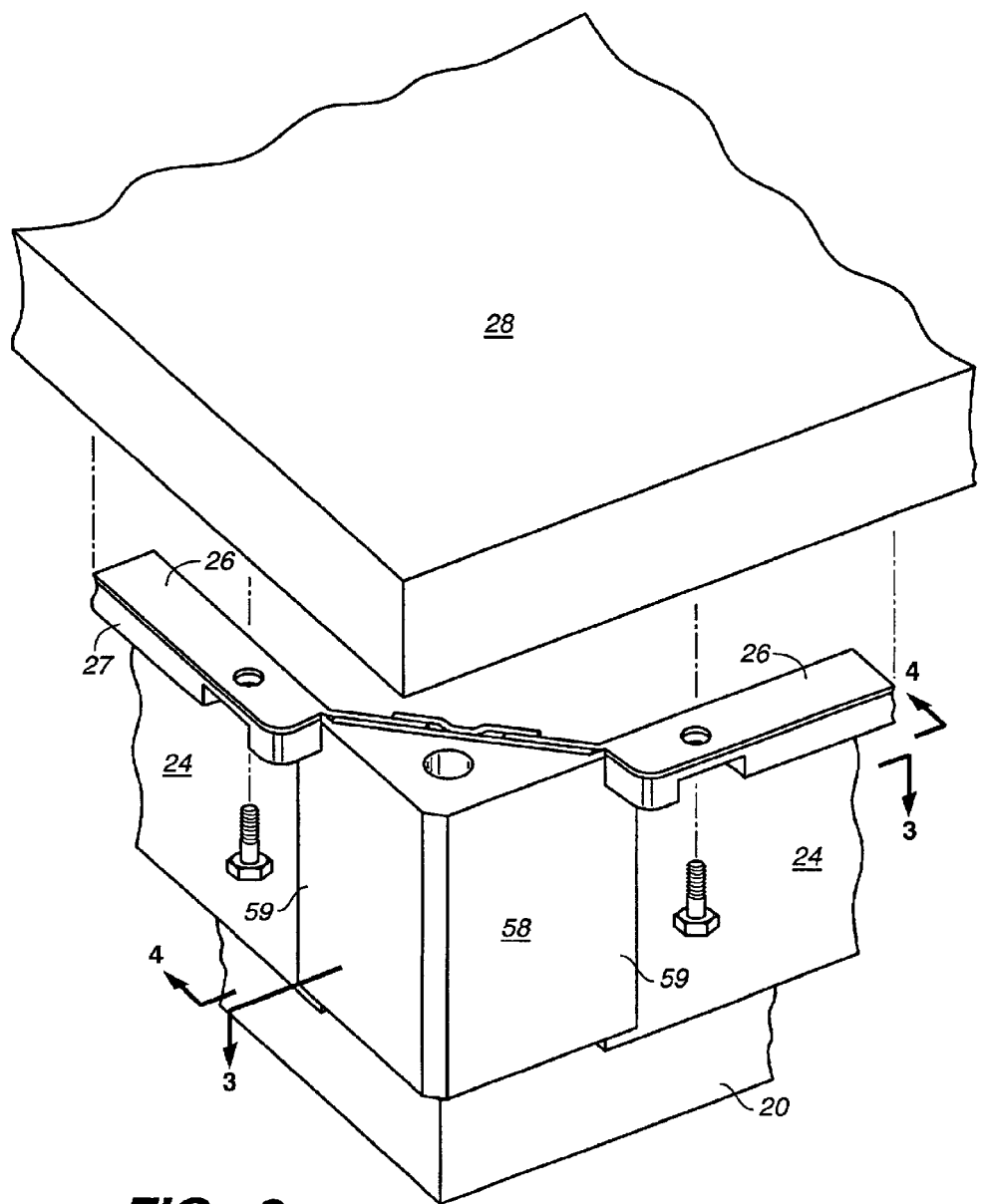
FIG._2

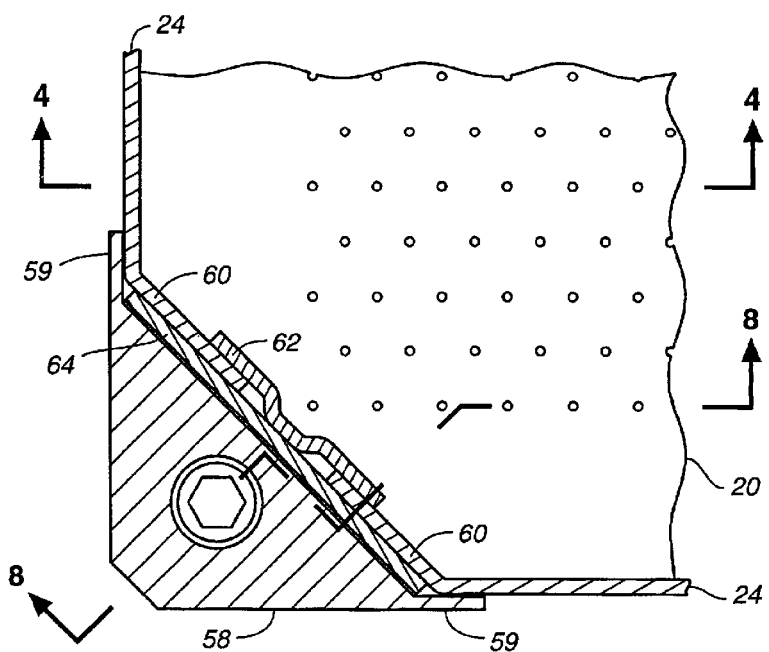
FIG._3
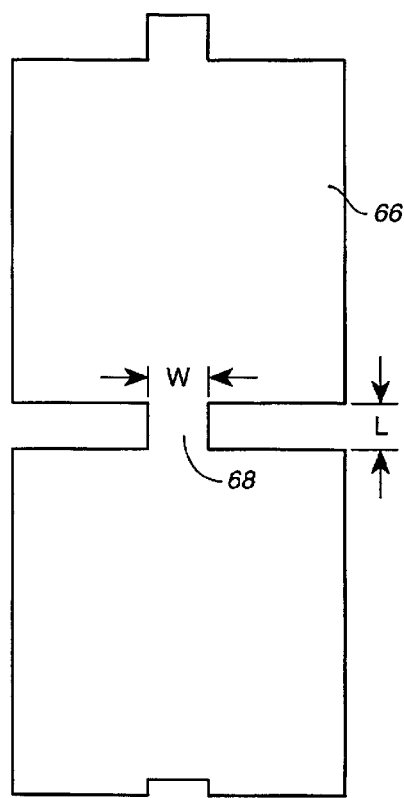
FIG._10

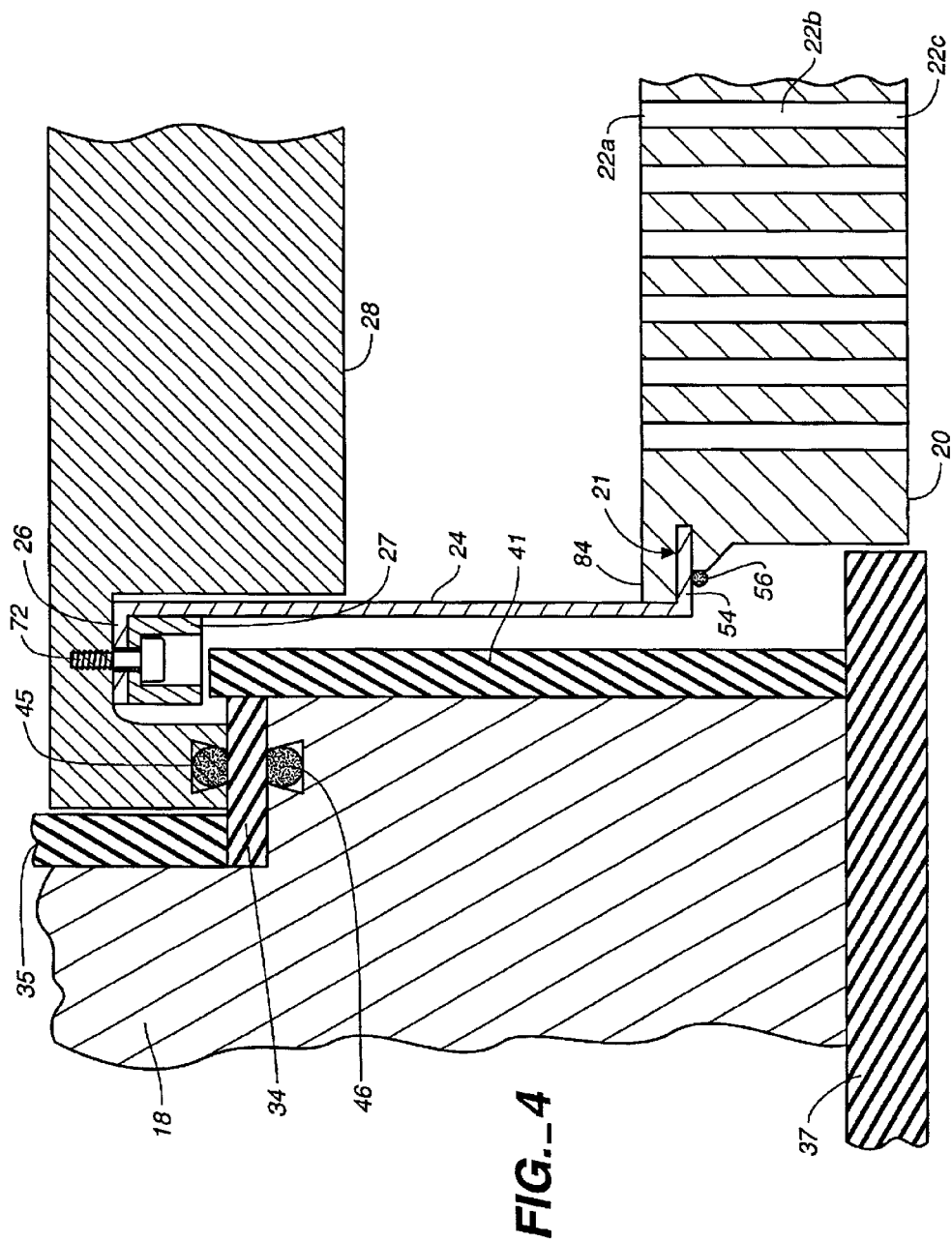
FIG._4

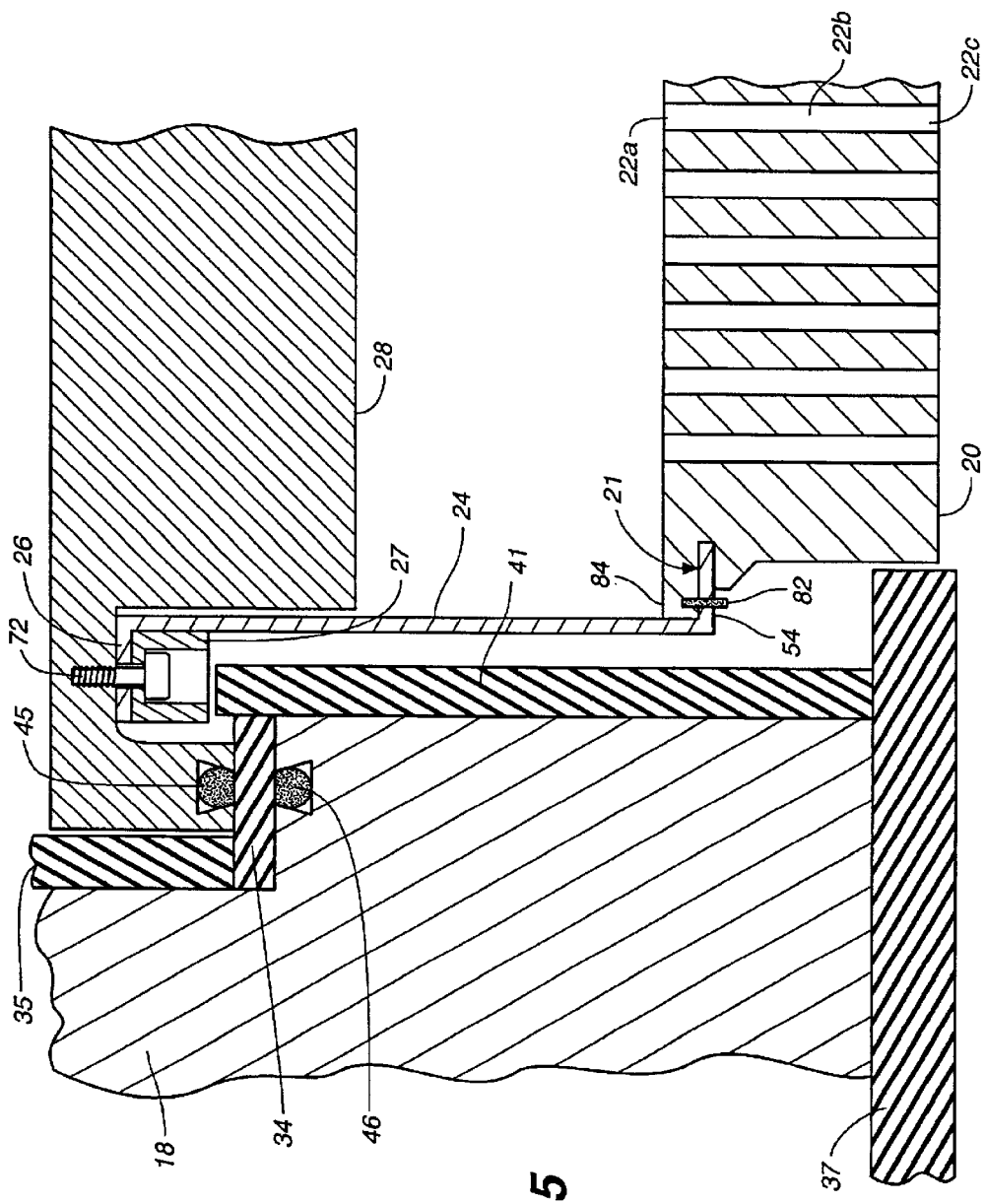
FIG._5

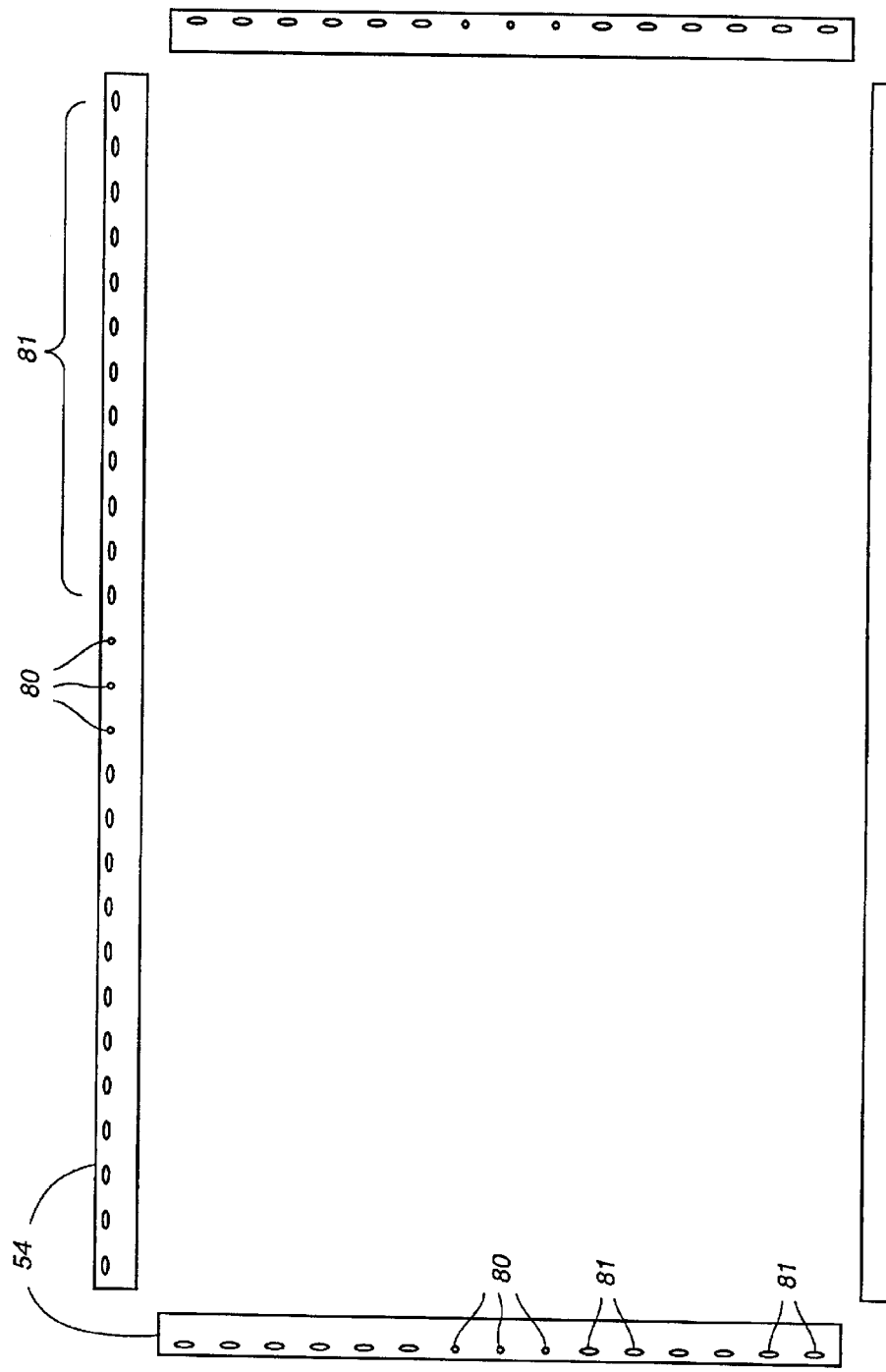
FIG._6

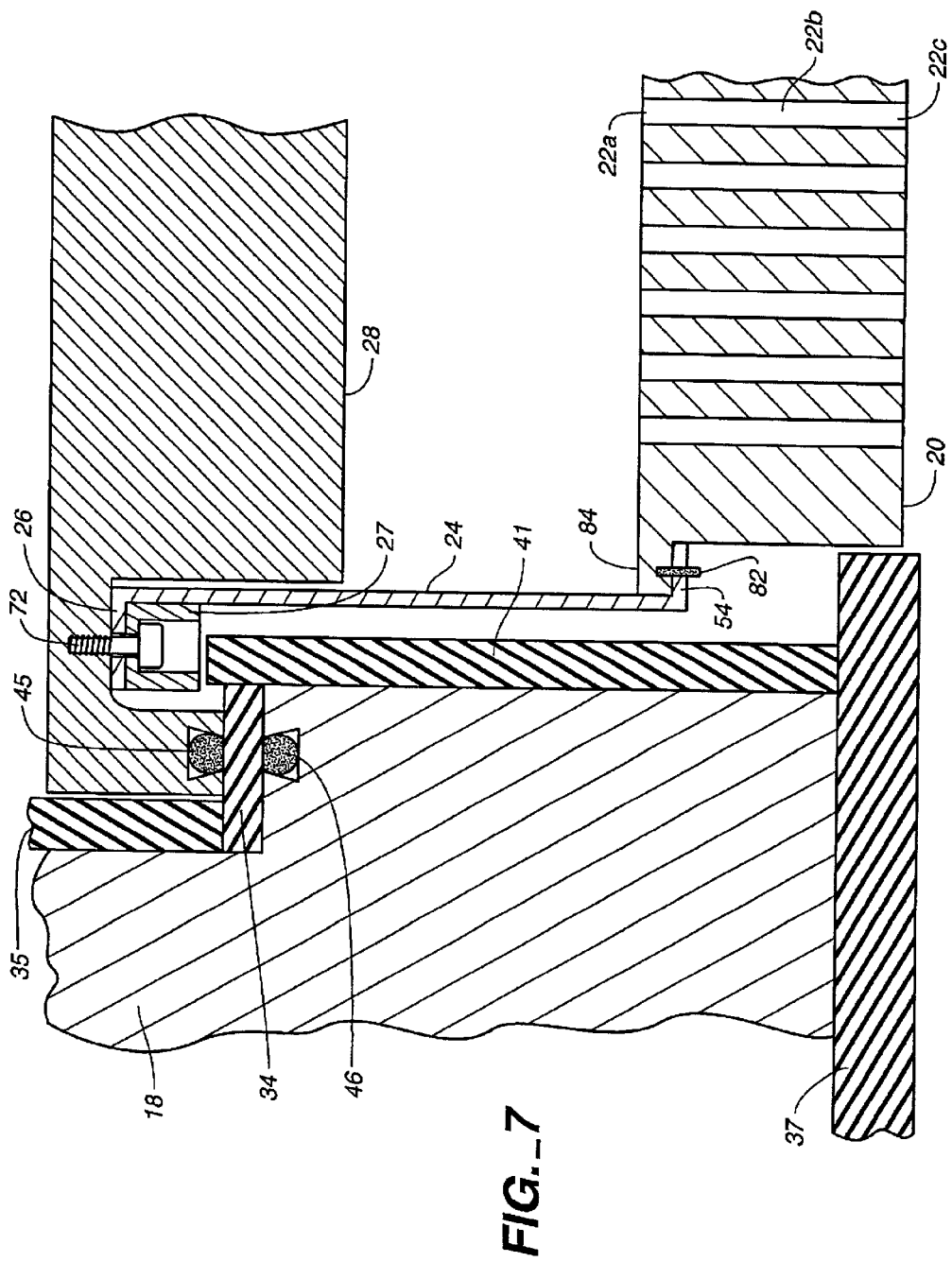

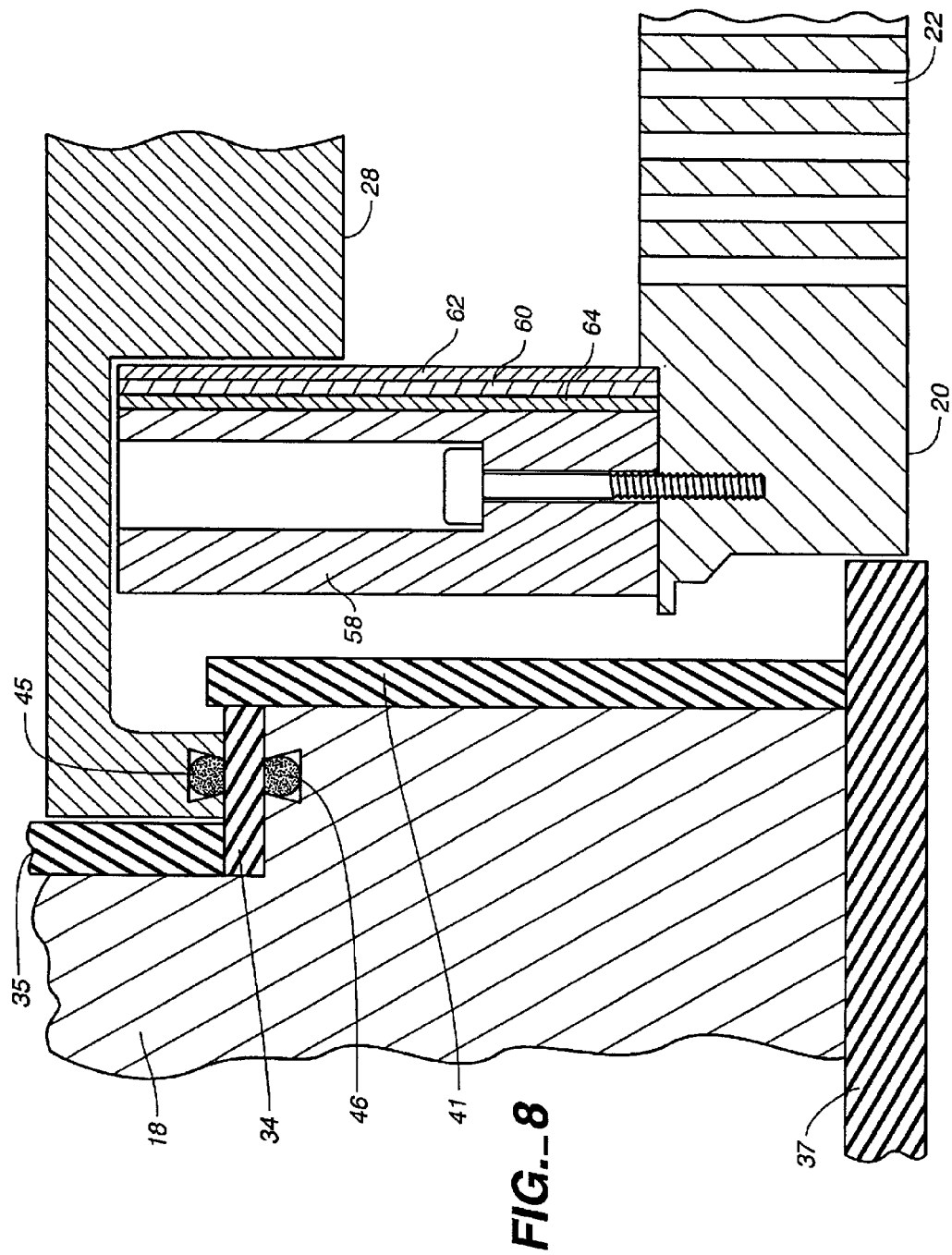
FIG._8

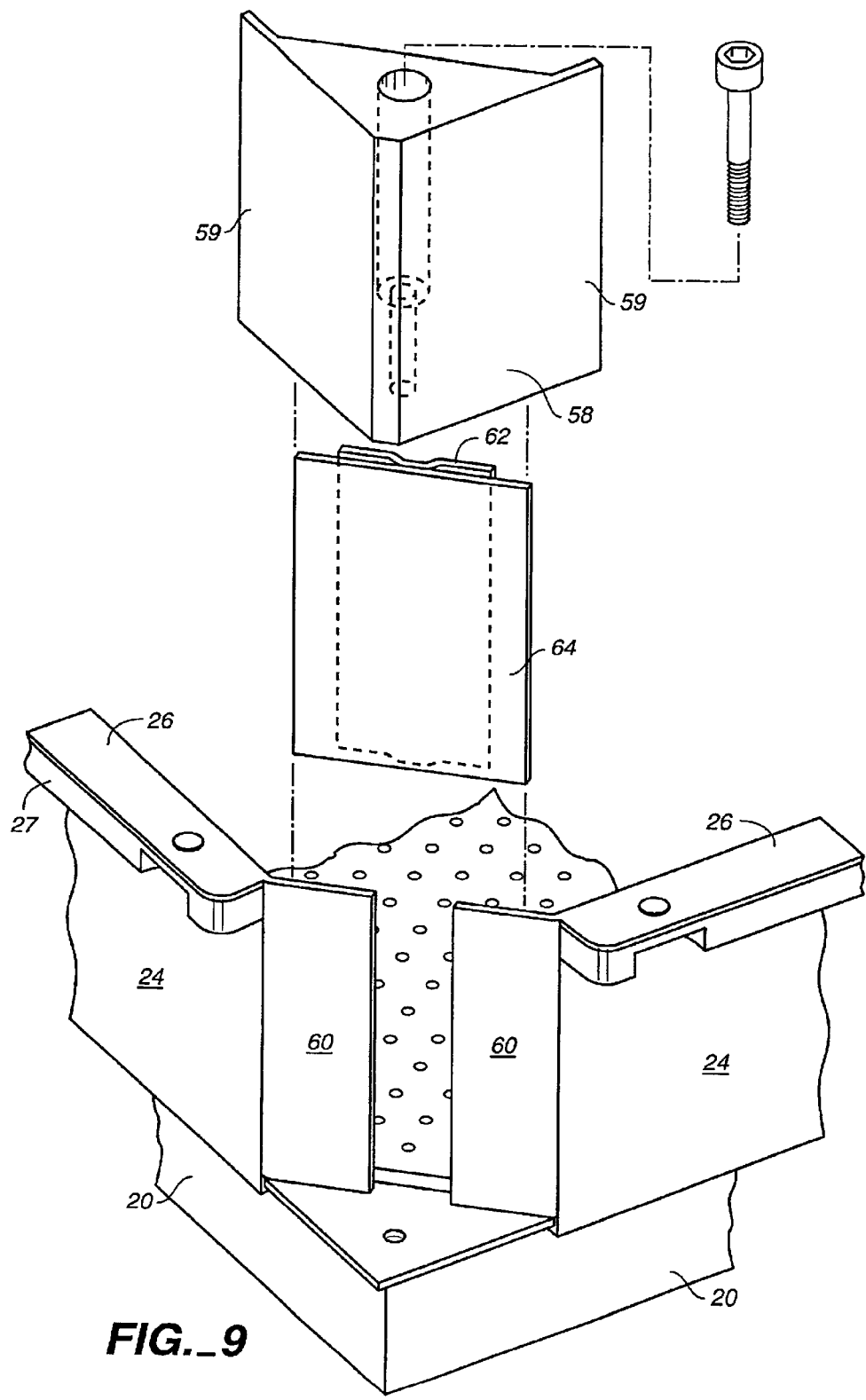
FIG._9

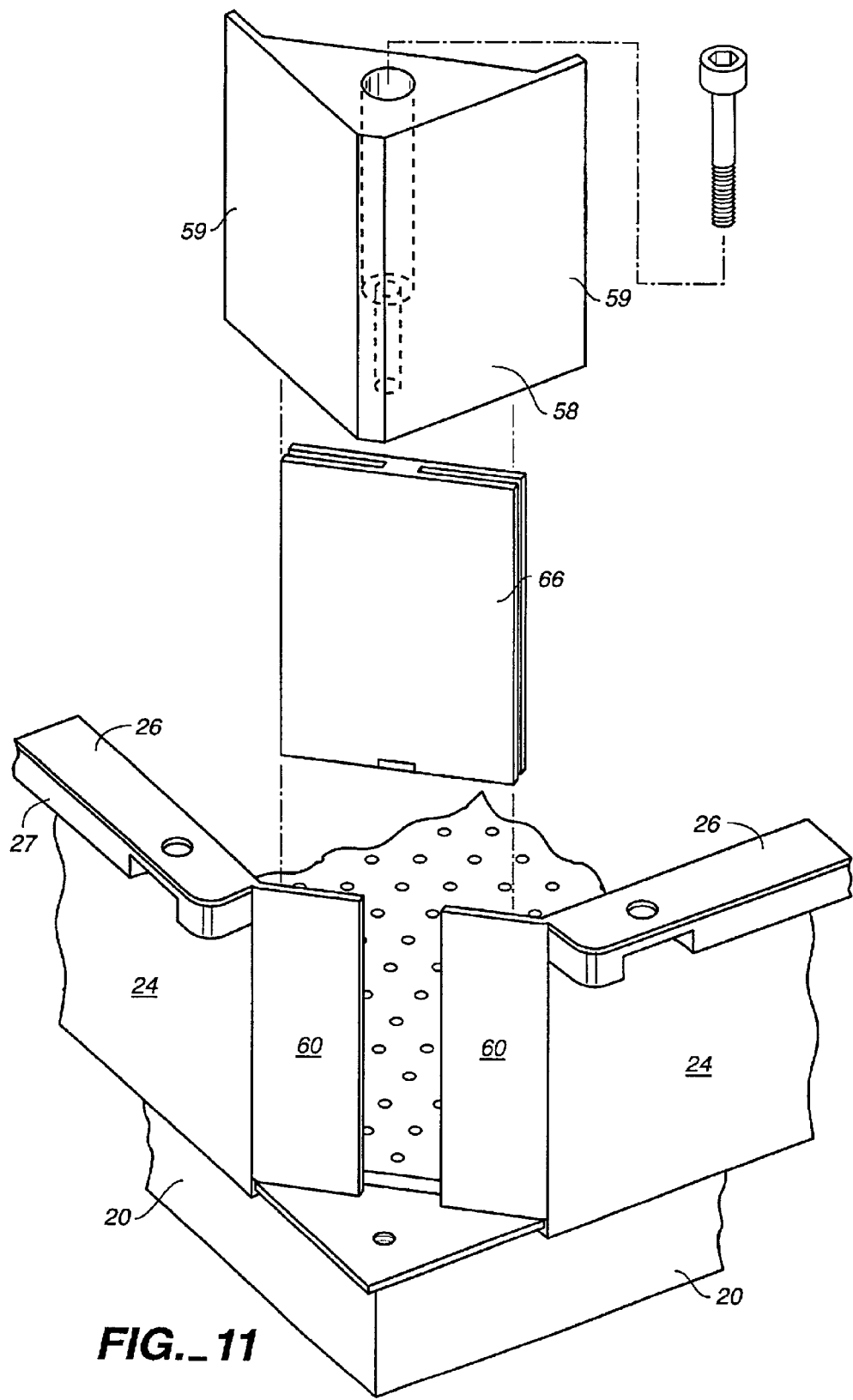
FIG._11

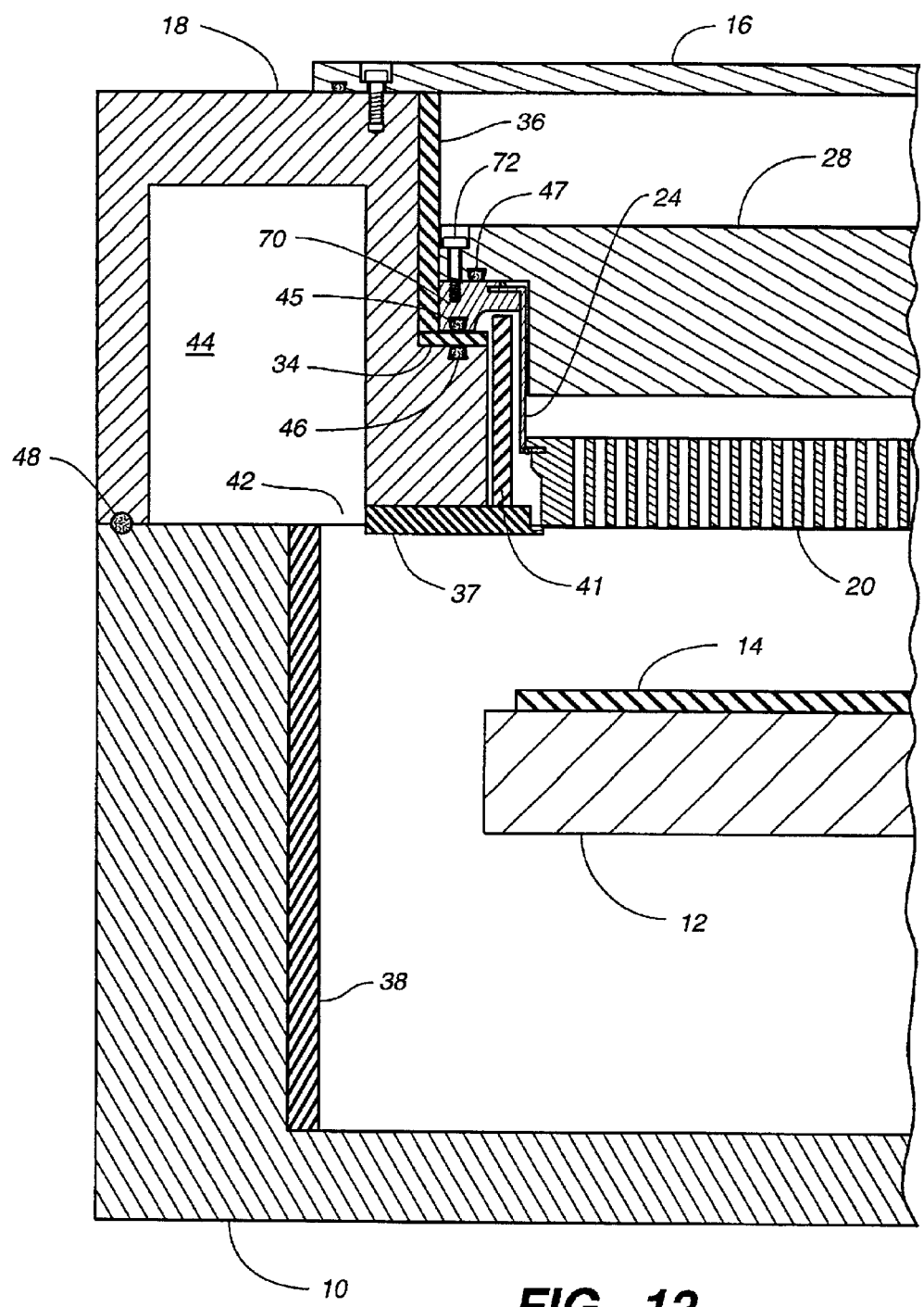
FIG._12

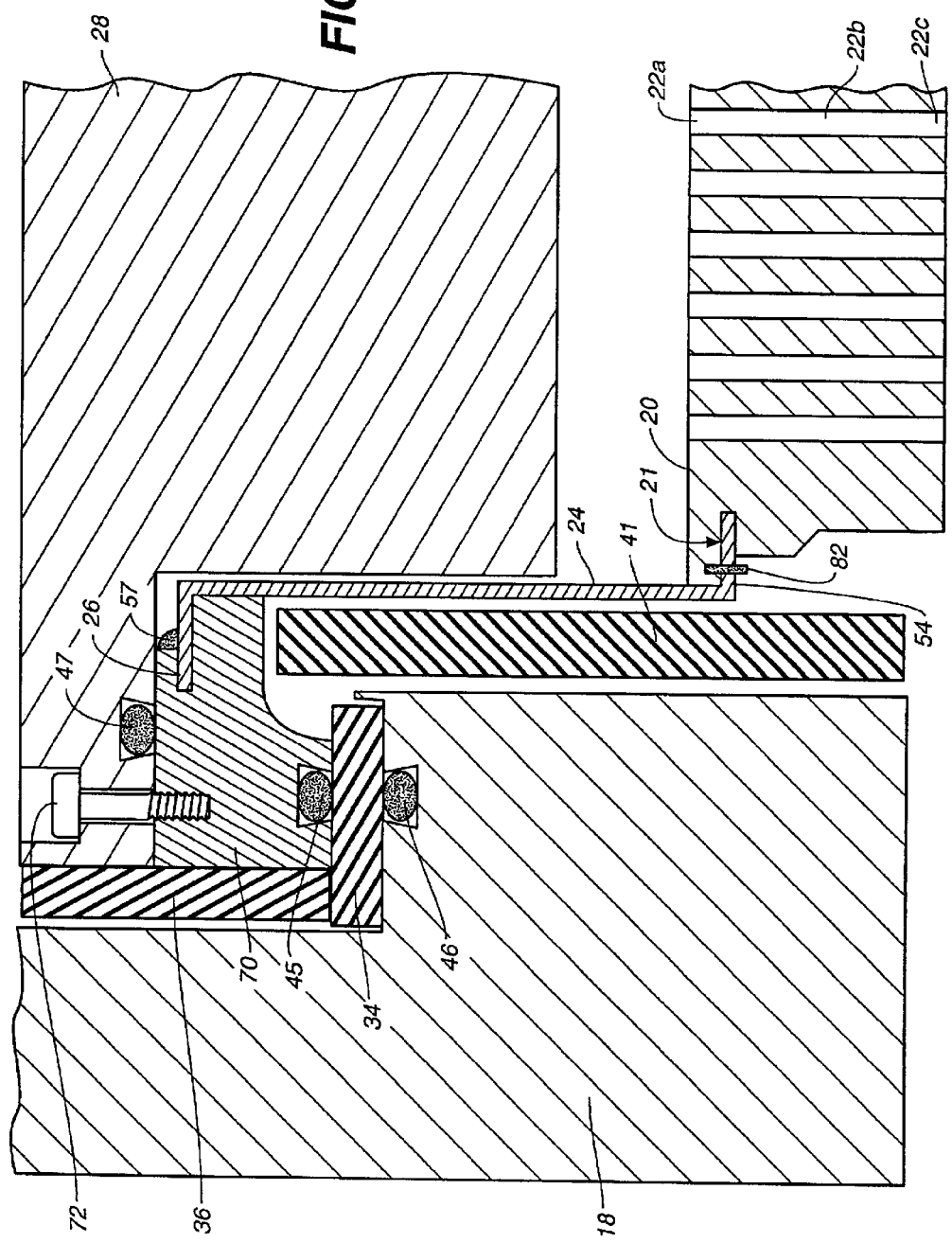

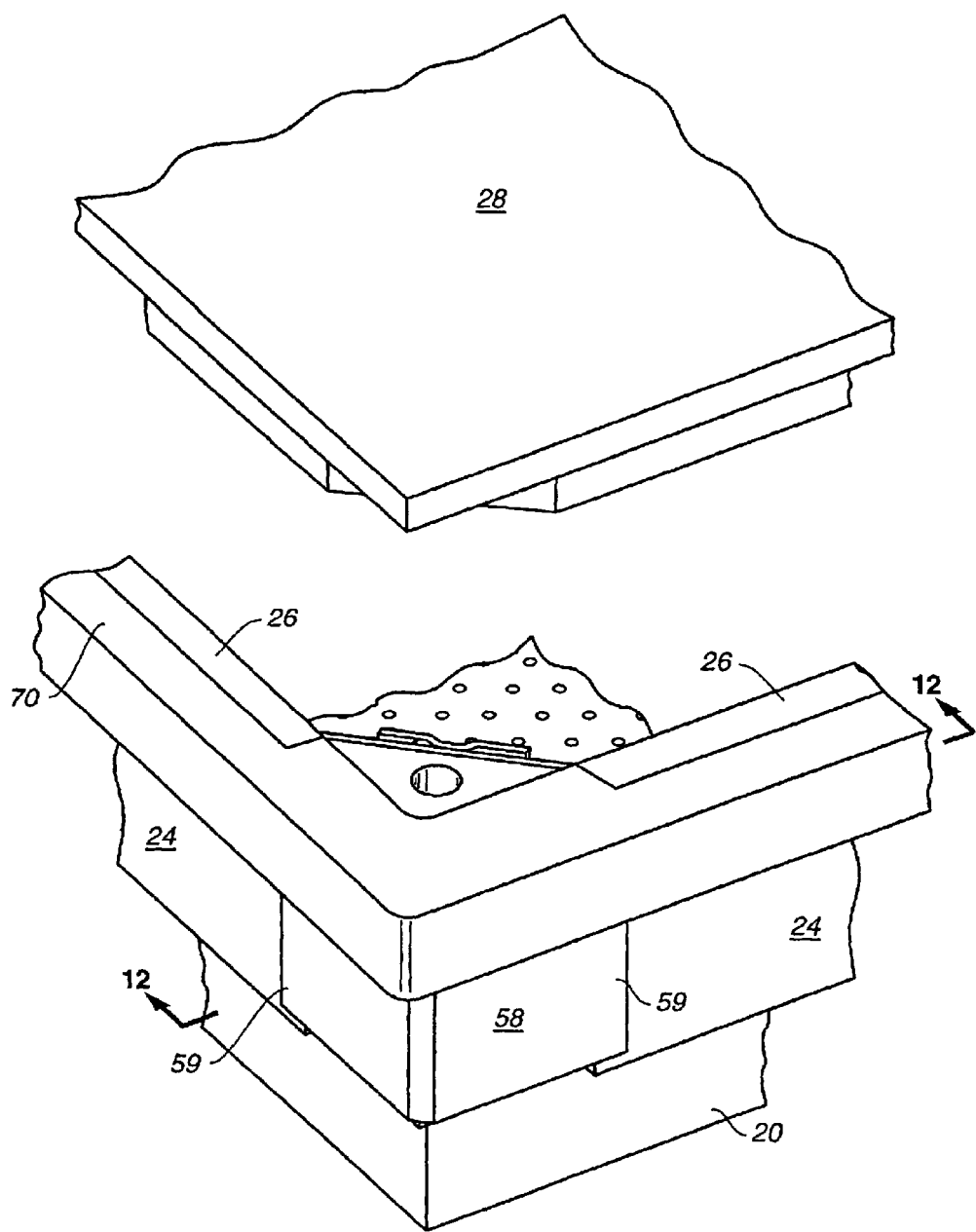
FIG._14

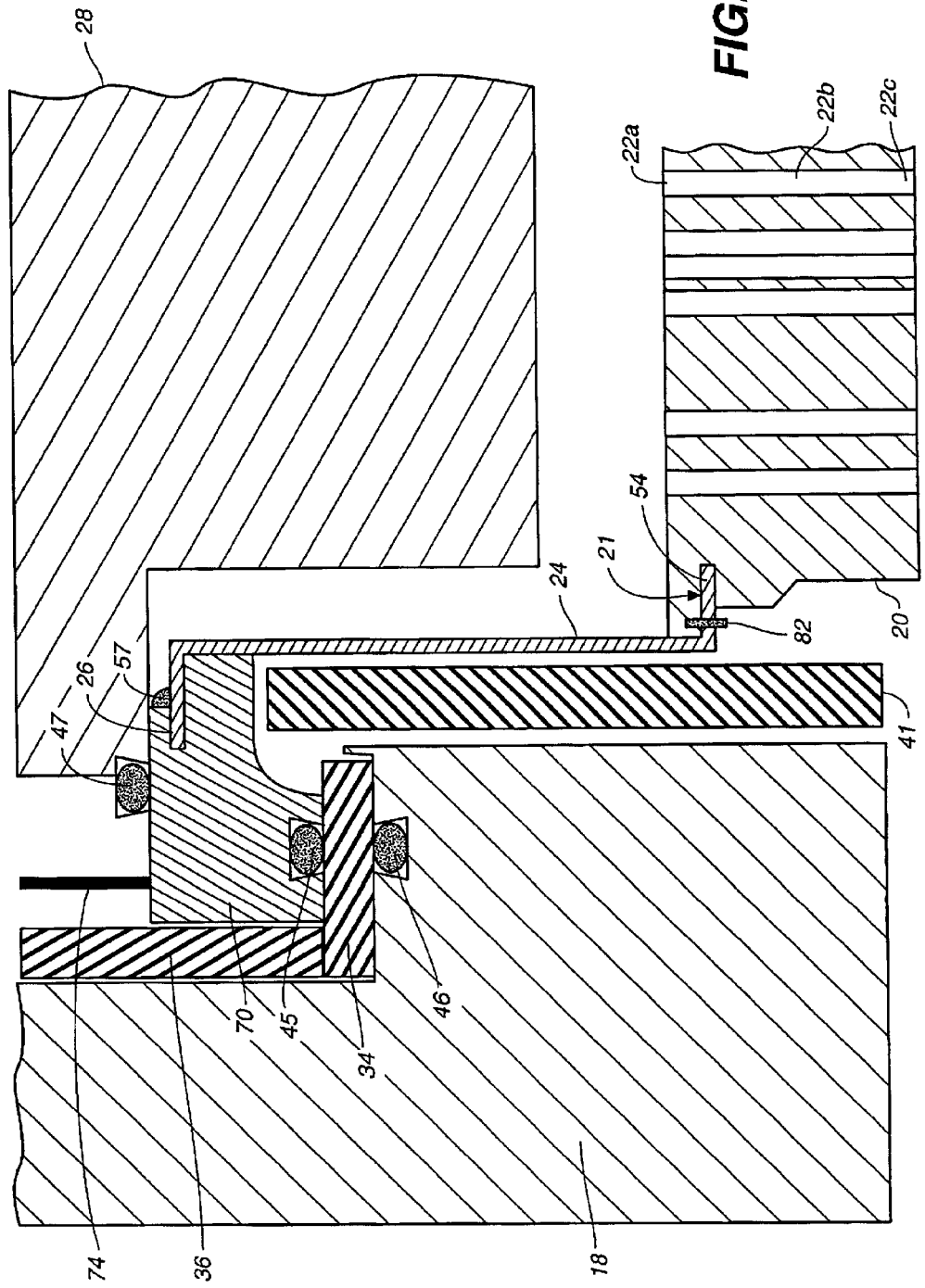
FIG._15

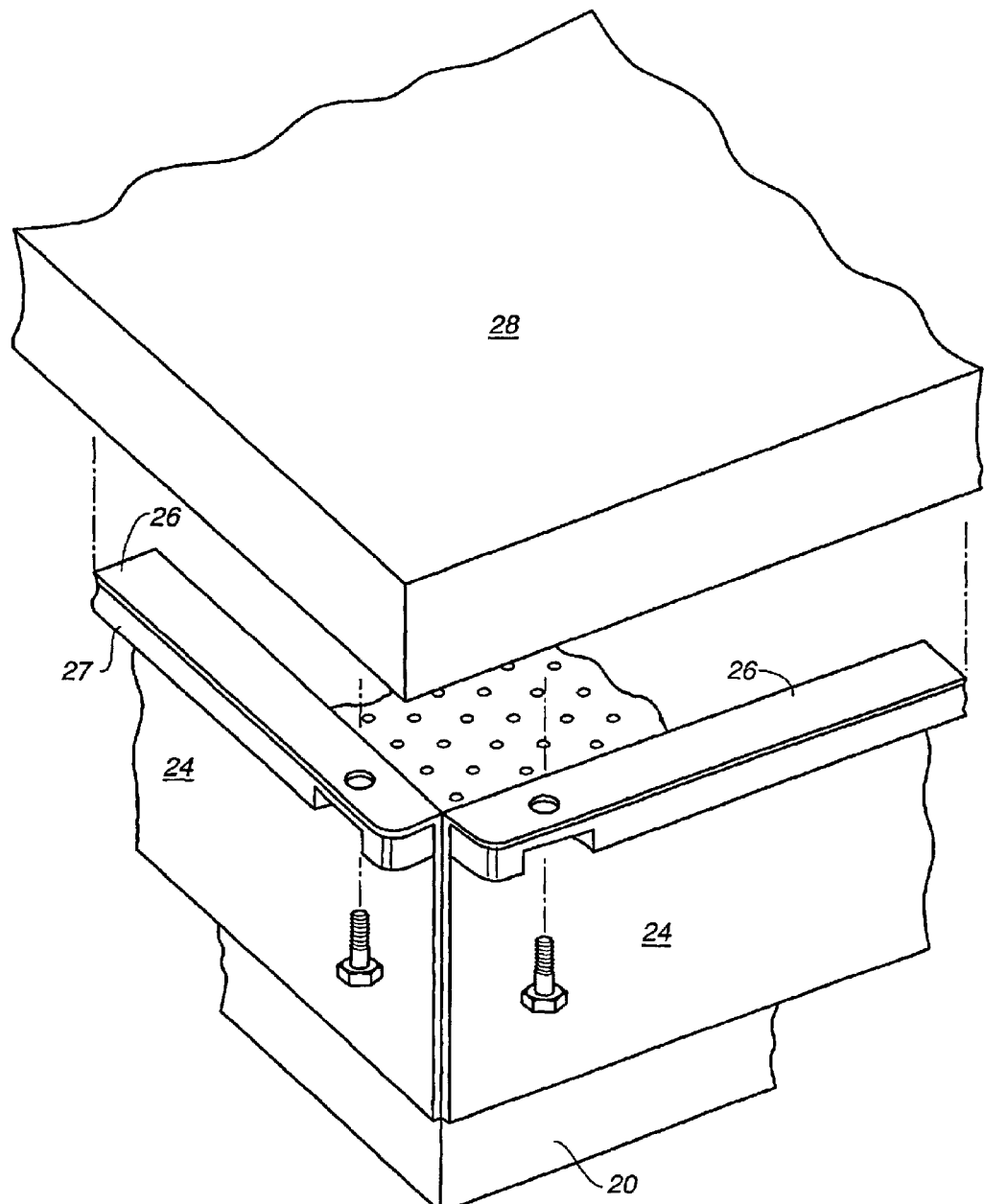
FIG._16

SUSPENDED GAS DISTRIBUTION MANIFOLD FOR PLASMA CHAMBER

CROSS REFERENCE TO RELATED APPLICATION

This patent application is a continuation-in-part of application Ser. No. 09/488,612 filed Jan. 20, 2000 by John White et al. entitled "Flexibly Suspended Gas Distribution Manifold for Plasma Chamber", now U.S. Pat. No. 6,477,980 issued Nov. 12, 2002.

FIELD OF THE INVENTION

The invention relates generally to gas distribution manifolds for supplying gas to a plasma chamber. More specifically, the invention relates to such a manifold having a perforated gas distribution plate suspended by a thin side wall.

BACKGROUND OF THE INVENTION

Electronic devices, such as flat panel displays and integrated circuits, commonly are fabricated by a series of process steps in which layers are deposited on a substrate and the deposited material is etched into desired patterns. The process steps commonly include plasma enhanced chemical vapor deposition (CVD) processes and plasma etch processes.

Plasma processes require supplying a process gas mixture to a vacuum chamber called a plasma chamber, and then applying electrical or electromagnetic power to excite the process gas to a plasma state. The plasma decomposes the gas mixture into ion species that perform the desired deposition or etch process.

In capacitively excited CVD chambers, the plasma is excited by RF power applied between an anode electrode and a cathode electrode. Generally the substrate is mounted on a pedestal or susceptor that functions as the cathode electrode, and the anode electrode is mounted a short distance from, and parallel to, the substrate. Commonly the anode electrode also functions as a gas distribution plate for supplying the process gas mixture into the chamber. The anode electrode is perforated with hundreds or thousands of orifices through which the process gas mixture flows into the gap between the anode and cathode. The orifices are spaced across the surface of the gas distribution plate so as to maximize the spatial uniformity of the process gas mixture adjacent the substrate. Such a gas distribution plate, also called a diffuser or "shower head", is described in commonly assigned U.S. Pat. No. 4,854,263 issued Aug. 8, 1989 to Chang et al.

Perforated gas distribution plates typically are rigidly mounted to the lid or upper wall of the plasma chamber. Rigid mounting has the disadvantage of not accommodating thermal expansion of the perforated plate as it acquires heat from the plasma. The consequent mechanical stresses on the plate can distort or crack the plate. Alleviating mechanical stress is most important with the larger distribution plates required to process larger workpieces, such as large flat panel displays. Therefore, a need exists for a gas distribution device that minimizes such thermally induced mechanical stresses.

Another shortcoming of conventional diffusers or gas distribution plates is that they commonly operate at temperatures that are undesirably low and spatially non-uniform. Specifically, while the diffuser receives heat from the plasma in the chamber, a conventional diffuser generally loses heat at its perimeter where it is bolted to the chamber wall or lid. Therefore, the perimeter of the diffuser is significantly cooler than the center, which tends to produce a corresponding undesirable spatial non-uniformity in the surface temperature of the substrate positioned near the diffuser. Furthermore, the heat loss from the diffuser to the chamber wall undesirably reduces the temperature of the diffuser, which can undesirably reduce the substrate temperature.

SUMMARY OF THE INVENTION

The invention is a gas inlet manifold for a plasma chamber used for processing a substrate. The manifold has a perforated gas distribution plate or diffuser suspended by a side wall.

In one aspect of the invention, the side wall of the inlet manifold comprises one or more sheets. One advantage of suspending the diffuser by a sheet is that the sheet can be flexible so as to accommodate thermal expansion or contraction of the gas distribution plate, thereby avoiding distortion or cracking of the diffuser. Another advantage is that the sheet can interpose a substantial thermal impedance between the diffuser and cooler chamber components so as to improve the spatial uniformity of the diffuser temperature and reduce heat loss from the substrate to the diffuser.

In a preferred embodiment, each sheet has a long, narrow flange at its lower end. Each flange has a plurality of holes along its length that mate with pins mounted in the rim of the gas distribution plate. The holes are elongated in a direction parallel to the long dimension of the flange so as to permit differential movement between the flexible side wall and the gas distribution plate.

In another preferred embodiment, the flexible side wall has a plurality of segments separated by small gaps, and the manifold includes a novel sealing flange that minimizes gas leakage through the gaps while permitting movement of the flexible side wall segments.

In a second aspect of the invention, the inlet manifold side wall interposes substantial thermal impedance between the gas distribution plate and the chamber wall, thereby improving the spatial uniformity of the temperature of the gas distribution plate, as well as allowing the gas distribution plate to attain a higher temperature in response to heating from the plasma. This aspect of the invention helps improve spatial uniformity of the surface temperature of the substrate or workpiece, and it enables the workpiece to be reach a higher surface temperature relative to the temperature of the substrate support pedestal or susceptor. In this aspect of the invention, the side wall need not comprise a sheet.

BRIEF DESCRIPTION OF THE DRAWINGS

FIG. 1 is a sectional, partially schematic side view of a plasma chamber that includes the gas inlet manifold of the present invention.

FIG. 2 is a partially exploded perspective view of a corner of the gas inlet manifold.

FIG. 3 is a transverse sectional view of a corner support of the gas inlet manifold.

FIG. 4 is a vertical sectional view of one side of one embodiment of the gas inlet manifold in which the side wall is rigidly attached to the diffuser.

FIG. 5 is a vertical sectional view of one side of a more preferred gas inlet manifold in which the side wall can slide within a groove in the diffuser.

FIG. 6 is a plan view of the lower flange of the inlet manifold side wall having elongated holes to accommodate thermal expansion of the diffuser.

FIG. 7 is a vertical sectional view of one side of an alternative gas inlet manifold in which the diffuser has no circumferential groove.

FIG. 8 is a vertical sectional view of a corner of the gas inlet manifold.

FIG. 9 is an exploded view of the corner shown in FIG. 2.

FIG. 10 is a plan view of an alternative corner junction or coupler before it is folded.

FIG. 11 is an exploded view of a corner having the alternative coupler of FIG. 10.

FIG. 12 is a view similar to FIG. 4 of an alternative embodiment having a gas inlet manifold in which a portion of the top flange of the flexible side wall is exposed to atmospheric pressure.

FIG. 13 is a detail of FIG. 12.

FIG. 14 is a view similar to FIG. 2 of the alternative embodiment of FIG. 12.

FIG. 15 is a view similar to FIG. 13 showing an electrical cable connected directly to the top flange of the side wall of the gas inlet manifold.

FIG. 16 is a partially exploded perspective view of a corner of an alternative gas inlet manifold in which the flexible side walls abut at the corners and the corner couplers are omitted.

DETAILED DESCRIPTION OF THE PREFERRED EMBODIMENTS

Plasma Chamber Overview

Figure 17:
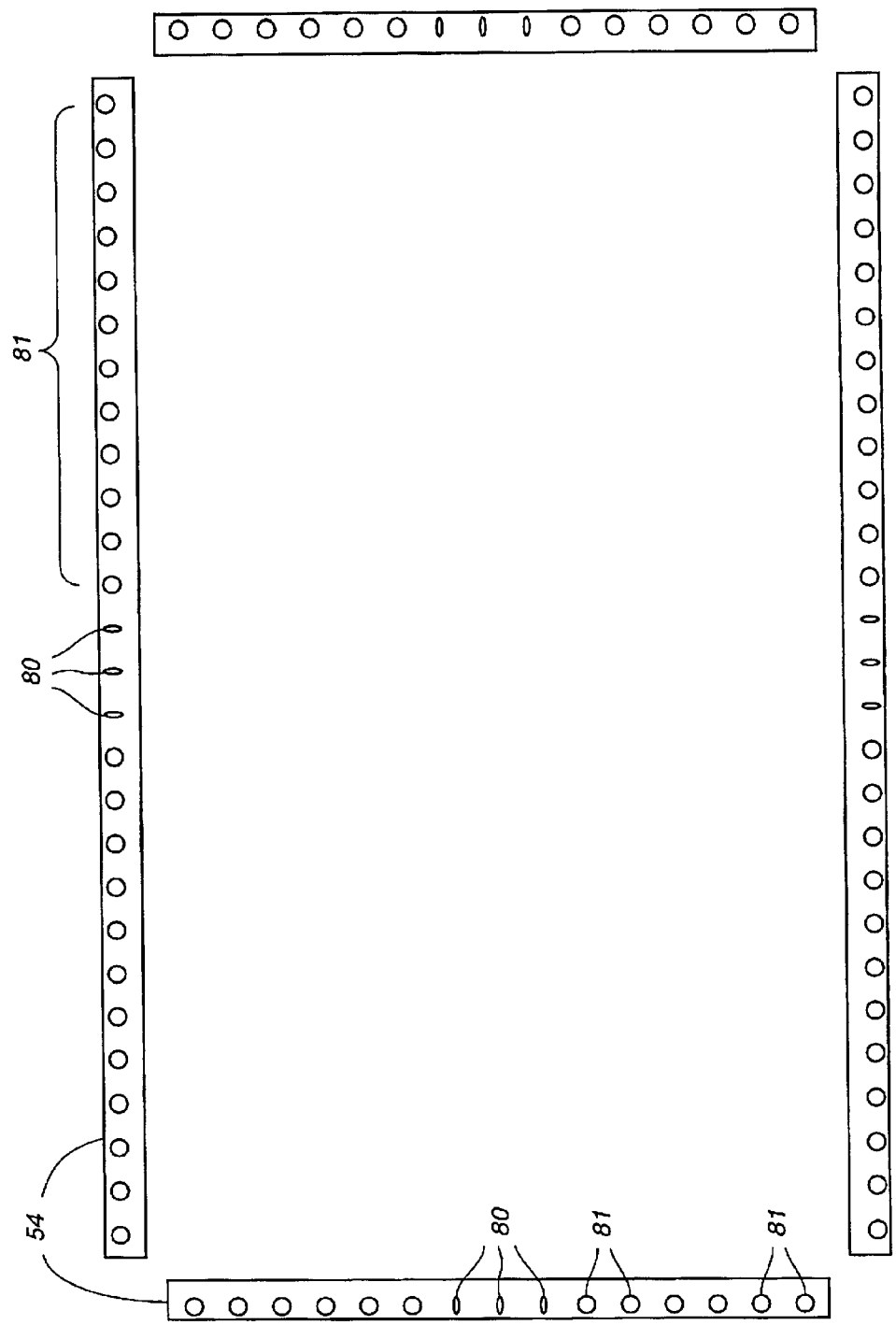
FIG. 17 is a plan view of the lower flange of the inlet manifold side wall having enlarged holes to accommodate thermal expansion of the diffuser.

FIG. 1 shows a plasma chamber that includes a gas inlet manifold 20–32, also called a gas distribution manifold or plenum, according to the present invention. The illustrated chamber is suitable for performing plasma-assisted processes such as chemical vapor deposition (CVD) or etching on a large substrate. It is especially suitable for performing CVD processes for fabricating the electronic circuitry of a flat panel display on a glass substrate.

The plasma chamber or vacuum chamber has a housing or wall 10, preferably composed of aluminum, that encircles the interior of the chamber. The chamber wall 10 provides the vacuum enclosure for the side, and much of the bottom, of the chamber interior. A metal pedestal or susceptor 12 functions as a cathode electrode and has a flat upper surface that supports a workpiece or substrate 14. Alternatively, the substrate need not directly contact the susceptor, but may be held slightly above the upper surface of the susceptor by, for example, a plurality of lift pins, not shown.

An external gas supply, not shown, delivers one or more process gases to the process chamber. Specifically, the chamber includes a gas inlet manifold or plenum 20–32 (described in detail below) that encloses a region referred to as the manifold interior. A gas line or conduit extending from the external gas supply to a gas inlet aperture or orifice 30 in a top wall or back wall 28 of the gas inlet manifold supplies the process gases into the manifold interior. The gases then flow out of the manifold through hundreds or thousands of orifices 22 in a gas distribution plate or diffuser 20 so as to enter the region of the chamber interior between the gas distribution plate and the susceptor 12.

A conventional vacuum pump, not shown, maintains a desired level of vacuum within the chamber and exhausts the process gases and reaction products from the chamber through an annular exhaust slit 42, then into annular exhaust plenum 44, and then through an exhaust channel, not shown, to the pump.

The gas distribution plate or diffuser 20 is composed of an electrically conductive material, preferably aluminum, so that it can function as an anode electrode. An RF power supply, not shown, is connected between the gas distribution plate and the electrically grounded chamber components. A typical frequency for the RF power supply is 13 MHz. Because it is RF hot, the diffuser or gas distribution plate 20 is electrically insulated from the lid by annular dielectric spacers 34, 35, 36. The chamber side and bottom wall 10 and the lid 18 are connected to electrical ground. The susceptor or workpiece support pedestal 12 typically is grounded also, but it optionally can be connected to a second RF power supply, commonly called the bias power supply.

The RF power applied between the cathode electrode (the susceptor 12) and the anode electrode (the gas distribution plate 20) produces an electromagnetic field in the region between the two electrodes that excites the gases in that region to a plasma state. The plasma produces reactive species from the process gas mixture that react with exposed material on the workpiece to perform the desired deposition or etch process.

To concentrate the plasma in the region of the chamber between the workpiece 14 and the gas distribution plate 20, other metal surfaces in the chamber that are near the distribution plate preferably are covered with dielectric liners. Specifically, a dielectric liner 37 is bolted to the underside of the chamber lid 18, and dielectric liner 38 covers the chamber side wall 10. To prevent plasma formation, and to minimize RF power conduction, in the annular gap between the gas inlet manifold and the lid, a dielectric liner 41 occupies that gap.

A removable lid 18 rests atop the chamber side wall 10 so that the lid functions as an additional portion of the chamber wall. The gas inlet manifold 20–32 rests on an annular, inwardly extending shelf of the lid. A cover 16 is clamped to the top of the lid 18. The only purpose of the cover is to protect human personnel from accidental contact with the portions of the gas inlet manifold that are RF hot, as described below.

The chamber components should be composed of materials that will not contaminate the semiconductor fabrication processes to be performed in the chamber and that will resist corrosion by the process gases. Aluminum is our preferred material for all of the components other than the dielectric spacers and liners 34–41 and the O-rings 45–48.

All portions of the plasma chamber other than the gas inlet manifold are conventional. The design and operation of conventional plasma CVD and etch chambers are described in the following commonly-assigned U.S. patents, the entire content of each of which is hereby incorporated by reference in this patent specification: U.S. Pat. No. 5,844,205 issued Dec. 1, 1998 to White et al.; and U.S. Pat. No. 4,854,263 issued Aug. 8, 1989 to Chang et al.

Gas Inlet Manifold

FIGS. 2–4 show the gas inlet manifold or plenum in more detail. The gas inlet manifold has an interior region that is bounded on the bottom by the gas distribution plate or diffuser 20, on the sides by the flexible side wall or suspension 24, and on the top by the top wall or back wall 28. (The triangular corner support post 58 shown in FIGS. 2 and 3 will be described later.)

In the illustrated embodiments, the gas distribution plate 20 is an aluminum plate that is 3 cm thick. Preferably it should be thick enough so that it is not significantly deformed under atmospheric pressure when a vacuum is created within the chamber.

In our novel gas inlet manifold design, the gas distribution plate 20 is suspended by a thin, flexible side wall or suspension 24, so that the suspension supports the entire weight of the gas distribution plate. As explained in the section below entitled "Flexible Suspension to Accommodate Thermal Expansion and Contraction", the suspension is flexible to minimize stress on the gas distribution plate in response to its thermal expansion and contraction. The upper end of the flexible side wall has an upper flange 26 that is directly or indirectly mounted to and supported by the chamber wall 10. By "indirect" mounting and support, we mean that the upper end of the suspension may be supported by the chamber wall through intermediate components that are interposed between the upper flange 26 and the chamber wall 10, such as the lid 18 and the inlet manifold back wall 28 in the embodiment of FIG. 1.

The top wall or back wall 28 of the gas inlet manifold is mounted so as to abut the upper end or upper flange 26 of the suspension, so that the back wall forms the upper boundary or enclosure of the interior region of the gas inlet manifold.

In the illustrated embodiments having a rectangular diffuser or gas distribution plate 20, the flexible side wall or suspension 24 preferably consists of four facets or segments, where each segment is a distinct piece of thin, flexible sheet metal. Each of the four segments of the side wall is attached to a corresponding one of the four sides of the gas distribution plate. The four segments or facets of the side wall or suspension 24 collectively encircle the interior of the gas inlet manifold.

The orifices 22 in the gas distribution plate should have a diameter smaller than the width of the plasma dark space in order to prevent plasma within the plasma chamber from entering the region enclosed by the gas inlet manifold, i.e., the region between the gas distribution plate 20 and the top wall or back wall 28 of the inlet manifold. The width of the dark space, and therefore the optimum diameter of the orifices, depends on chamber pressure and other parameters of the specific semiconductor fabrication processes desired to be performed in the chamber. Alternatively, to perform plasma processes using reagent gases that are especially difficult to dissociate, it may be desirable to employ orifices having a narrow inlet and a wider, flared outlet as described in the above-referenced U.S. Pat. No. 4,854,263 to Chang et al.

Preferably the gas inlet manifold also includes a gas inlet deflector consisting of a circular disc 32 having a diameter slightly greater than that of the gas inlet orifice 30 and suspended below the orifice by posts, not shown. The deflector blocks gases from flowing in a straight path from the gas inlet 30 to the directly adjacent holes 22 in the center of the gas distribution plate, thereby helping to equalize the respective gas flow rates through the center and periphery of the gas distribution plate.

Vacuum Seal When Inlet Manifold Side Wall Not Exposed to Atmosphere

In the embodiments shown in FIGS. 1–11, the upper surface of the top wall or back wall 28 is the only component of the gas inlet manifold that is exposed to the ambient atmospheric pressure, hence the back wall is the only component of the gas inlet manifold that requires a vacuum seal. Specifically, a vacuum seal between the chamber interior and the ambient atmosphere outside the chamber is provided by a first vacuum sealing material 45 between the inlet manifold back wall 28 and the dielectric spacer 34, and by a second vacuum sealing material 46 between the dielectric 34 and a surface of the chamber wall. In the illustrated embodiments, the latter surface is the surface of the chamber lid 18 on which the dielectric rests. Because the illustrated embodiments include a removable chamber lid 18, an additional vacuum sealing material 48 is required between the lid and the chamber side wall 10. Sealing materials 45, 46 and 48 preferably are O-rings.

In this embodiment, a gas tight seal is not required between the inlet manifold back wall 28 and the upper flange 26 of the flexible side walls 24. The only consequence of a gas leak at this junction would be that a small amount of process gas would enter the chamber interior through the leak rather than through the orifices 22 in the gas distribution plate 20. Consequently, in the illustrated preferred embodiment there is no O-ring between the back wall 28 and the upper flange 26 of the flexible side wall. The upper flange 26 is simply bolted to the back wall 28 by a plurality of bolts 72 inserted in threaded holes spaced around the rim of the back wall. (See FIG. 4.) Preferably, the bolts 72 clamp the upper flange between the back wall and a reinforcing bar 27 that is thicker and more rigid than the upper flange.

In typical operation of the chamber in which the gas distribution plate or diffuser 20 is to be connected to an RF power supply as described above, a reliable, low impedance, connection between the RF power supply and the diffuser is important to maintain a stable plasma. Because the inlet manifold side walls 24 are metal, they can provide good RF electrical contact between the gas distribution plate 20 and the inlet manifold back wall 28. Therefore, the electrical cable that connects the gas distribution plate to the RF power supply can be attached directly to the outer surface of the back wall rather than to the distribution plate. Attaching the RF cable directly to the gas distribution plate would be undesirable because it would expose the RF connector to the potentially corrosive process gas mixture. The bolts 72 help ensure good RF electrical contact between the inlet manifold back wall 28 and the upper flange 26 of the flexible side wall 24 of the inlet manifold. A good RF electrical contact between the lower flange 54 of the side wall 24 and the diffuser 20 is achieved by the weight of the diffuser maintaining pressure between the lower flange 54 and a circumferential groove 21 in the sides of the diffuser. In the FIG. 4 embodiment, weld beads 56 provide additional electrical contact between the lower flange and the diffuser.

Vacuum Seal When Reinforcing Flange of Side Wall is Exposed to Atmosphere

In an alternative embodiment shown in FIGS. 12–14, the reinforcing bar 27 is replaced by an outer reinforcing flange 70 whose perimeter is exposed to the external ambient atmosphere. This contrasts with the embodiments of FIGS. 1–11 in which the entire suspension 24, including the upper flange 26, is completely enclosed by the perimeter of the top wall or back wall 28 of the gas inlet manifold. Consequently, in the embodiment of FIGS. 12–14, the reinforcing flange 70 of the side wall must contribute to the vacuum seal between the chamber interior and the external ambient atmosphere, which requires one more O-ring than the previous embodiments.

As in the previous embodiments, two O-rings 45, 46 or other sealing material are required on either side of the dielectric spacer 34, i.e., a first O-ring 45 between the dielectric and the reinforcing flange 70 of the flexible side wall 24, and a second O-ring 46 between the dielectric and the lid 18. Unlike the previous embodiments, the present embodiment additionally requires a third O-ring 47 or other sealing material between the reinforcing flange 70 and the back wall 28 of the inlet manifold.

In order to effect a vacuum seal between the outer reinforcing flange 70 and the back wall 28 of the gas inlet manifold, the portion of the reinforcing flange 70 in contact with the third O-ring 47 must be continuous and uninterrupted around the complete circle of the O-ring (see FIG. 14), in contrast with the previous embodiments in which the upper flange 26 did not extend around any of the four corners of the gas inlet manifold.

There is no need for the flexible side wall or suspension 24 to be continuous and uninterrupted, since it is not part of the vacuum seal between the chamber interior and the external ambient atmosphere. Therefore, it can be four distinct segments as in the previous embodiments.

A plurality of bolts 72 spaced around the rim of the inlet manifold back wall 28 attach the reinforcing flange 70 of the suspension 24 to the back wall.

The outer reinforcing flange 70 preferably is shaped as a rectangular frame with an open center. It can be fabricated by cutting away or stamping the open center from a rectangular plate. The outer reinforcing flange 70 of this embodiment replaces the four reinforcing bars 27 of the previous embodiments. The reinforcing flange 70 preferably should have a smooth, flat upper surface abutting the inlet manifold back wall 28. To prevent the upper flange 26 of the suspension 24 from projecting above the plane of this upper surface, the upper flange 26 preferably is attached (e.g., by weld 57) to the reinforcing flange 70 at a shelf recessed below the upper surface of the reinforcing flange.

As in the previously discussed embodiments of FIGS. 1–11, in our preferred embodiment of FIGS. 12–14 we prefer to connect the RF cable directly to the upper surface of the inlet manifold back wall 28. The bolts 72 press the reinforcing flange 70 of the suspension 24 against the back wall 28 and thereby help ensure good RF electrical contact between the back wall and the suspension. An important advantage of the present embodiment over the embodiments of FIGS. 1–11 is that the bolts 72 can be located radially outward of the O-ring 47. Consequently, the O-ring 47 protects the bolts 72 —and, most importantly, the adjacent areas of electrical contact between the back wall 28 and the reinforcing flange 70 of the suspension—from exposure to the corrosive process gases and plasma within the chamber that eventually could degrade the electrical contact.

Unlike the embodiments of FIGS. 1–11, the embodiment of FIGS. 12–14 leaves the radially outer portion of the reinforcing flange 70 uncovered by the inlet manifold top wall or back wall 28. Therefore, this embodiment permits the electrical cable 74 from the RF power supply to be connected directly to the reinforcing flange 70 at an area radially outward of the perimeter of the inlet manifold back wall 28, as shown in FIG. 15. In this alternative implementation, because the electrical cable is not connected to the back wall, there is no need to ensure a low impedance electrical contact between the side wall 24 and the back wall. Preferably, in the FIG. 15 embodiment the reinforcing flange 70 is mechanically mounted to the back wall 28 using the same bolts 72 as in the embodiment of FIGS. 12–14, although the bolts are not shown in FIG. 15.

Flexible Suspension to Accommodate Thermal Expansion and Contraction

A novel and valuable function of the flexible side wall or suspension 24 of our inlet manifold is that it minimizes mechanical stresses to the gas distribution plate or diffuser 20 when the diffuser undergoes thermally induced expansion and contraction. (The gas distribution plate is referred to as the diffuser for brevity.) If the diffuser were mounted in the chamber rigidly rather than by our novel flexible suspension, we expect that differences in temperature and in thermal expansion coefficients between the diffuser and the chamber component to which it is mounted would produce mechanical stress in the diffuser that eventually would distort or crack the diffuser.

The amount by which the diffuser 20 expands is proportional to both the size of the diffuser and its temperature. Therefore, alleviating mechanical stress is most important with the larger diffusers required to process larger workpieces, such as large flat panel displays. For reasons described below, it is desirable to maintain the diffuser at 250° to 375° C. during the operation of a CVD process. We find that at such temperatures an aluminum diffuser expands by about one percent (1%) in each dimension. For example, the width of a 30 cm×35 cm diffuser expands by about 3 mm, and the width of a 105 cm×125 cm diffuser expands by about 12 mm. Relative to a fixed reference point in the center of the diffuser, each edge of the diffuser expands outward by half this amount (0.5%).

When the width of the diffuser 20 expands in response to its temperature increase during normal operation of the chamber, it forces the flexible side wall or suspension 24 to bend outward (i.e., in a direction roughly perpendicular to the plane of the side wall) by the amount of the diffuser expansion. The side wall should be flexible enough to bend by that amount without substantial force. In particular, the bending force between the diffuser and the side wall should be low enough to avoid cracking or distorting the diffuser. More specifically, the bending force should be low enough to prevent distorting the shape of the diffuser by more than 0.1 mm=100 microns, more preferably by no more than 0.025 mm=25 microns, and most preferably by no more than 0.01 mm=10 microns. It is especially important to avoid more than this amount of distortion of the flatness or contour of the surface of the diffuser that faces the substrate 14.

We successfully tested two prototypes of the design shown in FIGS. 1–6: one prototype had a 30 cm×35 cm diffuser 20 and a 50 mm tall side wall 24, and the other prototype had a 105 cm×125 cm diffuser and a 55 mm tall side wall. In both prototypes the side wall was sheet aluminum having a thickness of 1 mm. A greater thickness would be less desirable because it would reduce both the flexibility and the thermal resistance of the side wall. Nevertheless, we contemplate that the side wall sheet in the invention can be as much as 2 mm or 3 mm thick.

Although it is simplest to construct the flexible side wall or suspension 24 entirely of flexible sheet aluminum so that the side wall is flexible along its entire height, this is not required. It suffices for the suspension to include at least one flexible portion somewhere between the upper end 26 and the lower end 54.

Design parameters that reduce the bending force are: (1) selecting a more flexible material for the flexible portion of the suspension; (2) decreasing the thickness of the flexible portion; and (3) increasing the length (i.e., height) of the flexible portion. By length or height we mean the dimension of the flexible portion of the side wall along the direction perpendicular to the plane of the diffuser.

As stated above, in response to heating during operation of the chamber, our 105 cm×125 cm diffuser expanded in width by one percent or 12 mm. Therefore, each of the four side walls was laterally deflected by half this amount, which is 6 mm. The angle at which each side wall bends is the lateral deflection of the side wall divided by the height of the side wall, which in this example is 6 mm/55 mm=0.11 radians=6.3 degrees. Therefore, in our example, the side wall or suspension 24 should be flexible enough (i.e., sufficiently thin and long) to bend at least 6.3 degrees without exerting substantial force on the diffuser. As stated above, such bending force preferably should not distort the shape of the diffuser by more than 10 or 25 microns.

In the illustrated preferred embodiment, the substrate 14 and the diffuser 20 are rectangular. Although the flexible side wall 24 can be a single, unbroken annulus with a rectangular cross section, an unbroken design is not preferred because thermally induced mechanical expansion and contraction of the diffuser would produce excessive stress at the corners of the side wall 24. Our preferred design for avoiding such stress is to divide the flexible side wall into four segments or facets, one for each side of the rectangular diffuser, and to provide at each corner a novel expansion joint that allows only a negligible amount of gas to leak at the joint.

Specifically, the inlet manifold side wall or suspension 24 preferably consists of four distinct segments of thin, flexible sheet aluminum respectively located at the four sides of the rectangular inlet manifold. (See FIGS. 2 and 3.) Each of the four segments 24 preferably is formed from a flat, rectangular piece of sheet metal whose upper end is bent 90° to form an outwardly extending upper flange 26, and whose lower end is bent 90° to form an inwardly extending lower flange 54. (See FIG. 4.)

Each of the four upper flanges 26 is reinforced by a rigid bar 27, preferably a 5 mm thick aluminum bar. Each reinforcing bar 27 is bolted to the underside of the inlet manifold back wall 28, and the corresponding upper flange 26 is sandwiched between the reinforcing bar and the back wall, thereby clamping the upper flange to the back wall.

Each of the four sides of the diffuser 20 has a circumferential groove 21 that extends across all, or almost all, of the width of the diffuser. To attach the flexible suspension or inlet manifold side wall 24 to the diffuser, each of the four suspension segments or facets 24 preferably has an inwardly extending lower flange 54 that is inserted in the corresponding groove 21 in the diffuser (FIG. 4).

In the FIG. 4 embodiment, the lower mounting flange 54 and the diffuser 20 are secured together by one or more weld beads 56. In tests of this embodiment with the previously described 300 mm×350 mm diffuser, we found that flexible suspension appeared to function successfully in accommodating thermal expansion and contraction of the diffuser as it heated and cooled when the plasma within the chamber was turned on and off during typical plasma process cycles.

We discovered one shortcoming of the embodiment just described in which the flexible suspension is rigidly attached to the diffuser. During normal operation of the chamber, the lid 18 remains closed at all times. The lid is opened only for scheduled maintenance or to repair an unexpected problem within the chamber. We discovered that if the chamber lid is opened without allowing the chamber to cool off, the low thermal mass of the flexible suspension or manifold side wall 24 causes it to cool off so much more rapidly than the diffuser, and hence to contract so much more rapidly, that the resulting mechanical stress can cause the flexible suspension to crack.

FIGS. 5 and 6 show a preferred design for attaching the flexible suspension or inlet manifold side wall 24 to the diffuser 20 so as to permit each segment of the inlet manifold side wall 24 to slide within the groove 21 in the diffuser. In our tests of this preferred embodiment, there was no evidence of cracking of the inlet manifold side wall or diffuser even when the chamber lid was opened to ambient atmosphere while the chamber was hot.

The key distinction of the design of FIGS. 5 and 6 is that the lower flange 54 of each segment of the inlet manifold side wall is permitted to slide within the groove 21 of the diffuser 20, but the lower flange includes a constraining feature that prevents the lower flange from sliding completely out of the groove. In our preferred embodiment, the constraining feature is a set of one or more holes 80, 81 in the lower flange 54 and an equal number of pins 82 attached to the diffuser. Each pin protrudes through a corresponding one of the holes, thereby constraining the lower flange from sliding in the groove by an amount greater than the width of each hole.

In our preferred embodiment, each pin 82 is press fitted into a hole (not shown) in the diffuser. Alternatively, the holes in the diffuser could be threaded and screws could be substituted for the pins, but the screws should be longer than the threaded holes so that the screw heads cannot be tightened enough to prevent the lower flange 54 from sliding within the groove of the diffuser.

The process for initially attaching the suspension or inlet manifold side wall 24 to the diffuser 20 is as follows. With all of the pins removed from the diffuser, one of the inlet manifold side wall segments is positioned in the corresponding groove 21 of the diffuser so that its holes 80, 81 are aligned with the corresponding holes of the diffuser. The pins 82 are then inserted so as to pass through the holes 80, 81 of the side wall segment and are press fitted into the holes in the diffuser. At this point, the first side wall segment is constrained by the pins so that it cannot be completely removed from the groove of the diffuser. This assembly process is repeated for each of the other side wall segments 24.

FIG. 7 shows a less desirable alternative design in which the diffuser does not employ a circumferential groove, but merely has a circumferential lip 84 that rests on the lower flange 54 of the inlet manifold side wall 24. As in the FIG. 5 embodiment, the lower flange is attached to the diffuser by a plurality of pins or screws 82 press fitted or threaded into the diffuser that engage holes 80, 81 in the lower flange 54, so the features shown in FIG. 6 remain the same. One disadvantage of the FIG. 7 embodiment relative to the preceding embodiments is that the diffuser lip 84 resting on the lower flange 54 does not create as good a seal against leakage of gas from the inlet manifold. Another disadvantage is that the lower flange would tend to bend downward, thereby degrading the RF electrical contact between the lower flange and the diffuser and possibly causing the lower flange to crack or break.

FIG. 6 shows the lower flange 54 of each of the four segments of the inner manifold side wall 24. In each flange 54, the three centermost holes 80 are circular, and the remaining holes 81 are elongated. Each of the elongated holes 81 has a short axis (minor axis) and a long axis (major axis) which are mutually perpendicular. The long axis of each elongated hole 81 is parallel to the long axis of the groove 21 in the diffuser into which it the flange 54 inserted. (To more clearly illustrate the shapes of the holes 80, 81, FIG. 6 exaggerates the size of each hole and the width of each lower flange 54 relative to the length of each lower flange.)

Each segment of the inner manifold side wall 24 will be able to slide along the long axis of the groove 21 of the diffuser by as much as a "sliding distance" defined as the difference between the width of the long axis of each elongated hole 81 and the width, parallel to such long axis, of the pin 82 that is mated with such hole. In general, the long axis of each elongated hole should be large enough that this sliding distance is greater than the maximum expected difference between the expansion of the side wall segment and the expansion of the diffuser in response to temperature gradients during operation of the chamber.

If one wanted to dimension the elongated holes to accommodate a hypothetical worst case scenario of the diffuser undergoing heating and thermal expansion while the flexible suspension remained cold with zero expansion, then the sliding distance of each elongated hole should be the amount by which each side of the diffuser expands relative to a fixed point in the center of the diffuser. Using our estimate that, when heated to about 300° C., each side of the diffuser expands relative to the center by 0.5% of its total width, then the sliding distance of each elongated hole should be 0.5% of the width of the diffuser. Hence, the long axis of each elongated hole should be this amount plus the width or diameter of the pin.

One prototype of the invention we tested had a 105 cm×125 cm diffuser. As stated above, the maximum thermal expansion of each side of a diffuser of this size is about 0.5%=6 mm=0.24 inch. Therefore, to accommodate the worst case of a hot diffuser and a cold suspension, the sliding distance of each hole should be 0.24 inch, i.e., the long axis of each elongated hole should exceed the diameter of a pin by 0.24 inch.

Fortunately, this hypothetical worst case scenario will not occur in practice, since the diffuser cannot be heated or cooled without heating or cooling the adjoining portion of the suspension. During operation of the plasma chamber, the diffuser and side wall are heated and cooled gradually enough that the lower end of the side wall remains at almost the same temperature as the diffuser. As stated above, the greatest temperature differential that actually occurs in practice is when maintenance personnel open the chamber lid without waiting for the chamber to cool off. Even in that situation, we estimate that the temperature differential between the diffuser and the lower end of the side wall sheet 24 will be no more than 50° C. Therefore, the difference in thermal expansion between the diffuser and the lower end of the side wall will be much less than the total thermal expansion of the diffuser.

To determine the amount of differential expansion that the elongated holes should accommodate, we tested in a conventional plasma CVD chamber a prototype of the gas inlet manifold design of FIGS. 1–6 in which the diffuser width was 105 cm×125 cm, each pin 82 had a diameter of 0.099 inch (i.e., approximately 0.10 inch), and each elongated hole 81 had a short axis of 0.11 inch and a long axis of 0.19 inch. Therefore, the sliding distance along the long axis was 0.19 inch–0.10 inch=0.09 inch. The plasma chamber was operated in several cycles of heating and cooling, and the chamber lid was opened several times while the chamber was still hot. We then removed the gas inlet manifold from the chamber and inspected the lower flange 54 of the side wall. Slight abrasion marks on the edges of each elongated hole 81 indicated the distance over which the pin 82 slid within the hole. As expected, the holes farthest from the center evidenced the greatest sliding distance, but the observed distance was only about 0.03 to 0.04 inch. This is much less than the maximum sliding distance of 0.09 inch permitted by the long axis of the holes. Therefore, the elongated holes appeared to provide a substantial margin of safety to accommodate two or three times more differential thermal expansion than what we actually observed.

Conversely, the observed sliding distance of no more than 0.04 inch=1 mm is less than 0.1% of the width of the diffuser. Therefore, it should be possible to accommodate differential thermal expansion using elongated holes whose long axis exceeds the corresponding width of the pins by at least 0.03 inch or 0.04 inch or, more generally, by at least 0.1% of the width of the diffuser. The primary disadvantage of making the long axis greater than necessary is that a larger hole weakens the lower flange 54 so as to increase the risk that it will crack.

The short axis of each elongated hole 81 only needs to exceed the width of the mating pin 82 parallel to this axis by a very slight amount sufficient to prevent the pin from binding in the hole, so that the lower flange 54 will be free to slide along the long axis without binding. This slight difference in dimensions can be substantially less than the sliding distance along the long axis that was discussed in the preceding paragraphs. In the illustrated preferred embodiment, the short axis of each elongated hole 81 is 0.110 inch, which exceeds the 0.099 inch diameter of each pin 82 by 0.011 inch.

The invention would work if all of the holes in the lower flange 54 of the flexible suspension 24 were elongated as just described. However, there is no need for the entire lower flange to slide in the groove of the diffuser. Differential thermal expansion and contraction can be accommodated just as well if the lower flange is fixed to the diffuser at one point, so that the remainder of the lower flange is allowed to slide relative to this fixed point as the lower flange and diffuser expand and contract. Accordingly, in our preferred embodiment the three holes 80 closest to the center of each lower flange 54 are circular rather than elongated. Their diameter of each circular hole 80 is the same as the short axis of the elongated holes 81, namely, 0.110 inch. Since freedom from binding is not required for these fixed points, the circular holes 80 could be as small as the diameter of their corresponding pins 82.

Alternatively, the lower flange 54 of each segment of the suspension 24 could be welded or otherwise affixed to the diffuser at one point, preferably near the center of the lower flange 54, in which case the circular central holes 80 and their corresponding pins 82 could be omitted entirely.

An advantage of minimizing sliding of the lower flange 54 near its center, such as by using small circular holes 80 or welding as just described, is that it maintains the lower flange centered relative to the diffuser. In the prototype chamber, clearances around the inlet manifold are very tight, so accurate centering is important. This benefit also could be achieved using only one single circular hole 80 instead of three on each lower flange. Three circular holes were used in the preferred embodiment to ensure accurate centering even if one of the holes is inadvertently damaged.

The holes 80, 81 are spaced apart by 3.2 inches in the preferred embodiment. However, this spacing between holes is not critical, and a wide range of spacings would be expected to work well.

In embodiments (such as FIGS. 5 and 8) in which the top flange 26 of the side wall is directly mounted to the inlet manifold top wall or back wall 28 by bolts 72, it is preferable to avoid stress that may be caused by differential thermal expansion between the top flange 26 and the back plate 28. Accordingly, the holes in the top flange 26 through which the mounting bolts 72 pass should be fabricated with the same pattern of circular and elongated as the holes 80, 81 of the lower flange 54.

Corner Seal for Flexible Suspension

Since the preferred embodiment implements the flexible suspension or inlet manifold side wall 24 as four separate segments or facets, two adjacent side wall segments will meet near each of the four corners of the diffuser. A junction or seal between the edges of adjacent side wall segments 24 should be provided at each corner so that excessive process gas does not leak from the inlet manifold into the chamber at the junction. To preserve the benefit of our flexible inlet manifold side wall in accommodating thermal expansion of the diffuser, the junction should accommodate flexing of the inlet manifold side wall as the diffuser expands and contracts.

FIGS. 2, 3 and 9 show our preferred junction at each of the four corners of the diffuser. Both ends 60 of each of the four side wall segments 24 are bent inward at a 45 degree angle so that, at a given corner, the respective ends of the two adjacent side wall segments 24 are coplanar. A moderately gas-tight seal between the adjacent ends 60 is accomplished by a slotted coupler 62, 64 (alternatively called a slotted cover or slotted sealing member) that slips over the two ends 60. The coupler is fabricated by welding together two pieces of sheet aluminum along a vertical center seam, and bending one coupler piece 62 so as to create a slot between it and the other coupler piece 64. The slotted coupler is installed by slipping it over the two ends 60 so that the seam of the coupler is approximately centered in the gap between the two ends 60, and so that each end 60 fits snugly in a corresponding one of the two slots of the coupler. The slot is sized to fit around the end 60 with sufficient snugness so that it permits an amount of gas leakage from the inlet manifold to the chamber that is no more than a small fraction of the intended gas flow through the perforations 22. Nevertheless, the slot is sized large enough to permit radial movement of the ends 60 as the diffuser expands and contracts.

FIGS. 10 and 11 show an alternative design for the slotted cover or coupler consisting of a single, rectangular piece of sheet metal 66. A pair of rectangular notches is cut out as shown in FIG. 10 so as to leave only a thin bridge 68 between two halves of the coupler 66. The coupler 66 is folded in half at the bridge as shown in FIG. 11. The width W of the bridge 68 is narrow enough to slide between the two ends 60 of the two inlet manifold side walls that meet at a corner. The slotted coupler 66 is installed in the same manner as the previously described coupler 62, 64: by sliding the coupler 66 over the two ends 60. The length L of the bridge 68 determines the gap between the two halves of the coupler 66 when it is folded as shown in FIG. 11. This gap should be large enough to permit movement of the ends 60 as the inlet manifold side wall flexes in response to expansion and contraction of the diffuser, but it should be small enough so that the two halves of the slotted coupler 66 fit snugly around the ends 60 so as to minimize gas leakage as described in the preceding paragraph.

Our preferred embodiment additionally includes in each of the four corners of the gas inlet manifold a corner support post 58 having a triangular cross section as shown in FIGS. 2, 3, 8 and 9. The corner support post preferably is bolted to the diffuser 20 as shown in FIGS. 8 and 9, although alternatively it can be bolted to the back wall 28 of the inlet manifold. The corner support post should be spaced outward from the slotted coupler or seal 62, 64 so as to not interfere with movement of the slotted coupler as the diffuser expands and contracts.

The four corner support posts 58 perform two functions. The first function is to impede leakage of gas through the corners of the gas inlet manifold. This function is accomplished by the lips or wings 59 of the corner post. Each lip or wing 59 is a lateral extension of the corner post that extends across the interface between the adjacent slotted coupler 62-66 and the adjacent segment of the inlet manifold side wall 24 so as to overlap a that side wall segment 24 by a length sufficient to provide substantial impedance to gas leakage through the interface. Increasing the length of the overlap beneficially increases the impedance. In the preferred embodiment, an overlap of 0.28 inch provided sufficient impedance to leakage. We expect an overlap of 0.1 inch or greater would suffice. Although the fabrication method is not important to its operation, we fabricated each corner post, including the wings, as a unitary piece by machining a block of aluminum.

To prevent the corner support posts 58 from obstructing relative motion between the flexible suspension or side wall 24 and the diffuser 20, each corner support post should be slightly shorter than the height of the side wall, and should be spaced radially outward from the adjacent slotted coupler 62-66 by a gap sufficient to prevent them from abutting when the flexible side wall expands relative to the diffuser to the maximum expected extent. Likewise, each lip or wing 59 should be spaced radially outward from the adjacent segment of the side wall 24 by a gap sufficient to prevent them from abutting. In the preferred embodiment, both gaps were about 0.010 to 0.015 inch, and each corner post was about 0.005 to 0.010 inch shorter than the side wall.

The second function of the four corner support posts 58 is relevant only to maintenance, not operation, of the plasma chamber. This second function is to prevent the thin side walls 24 from collapsing when the gas inlet manifold assembly 20-32 is stored outside the plasma chamber, for example when the manifold assembly is stored as a spare part, or when it is removed from the plasma chamber to permit maintenance of the chamber.

Alternatively, the wings 59 can be omitted from the four corner support posts 58, because the gas leakage at the corners of the inlet manifold 24 may be minimal enough without the wings. Furthermore, if convenience of storage and maintenance as described in the preceding paragraph is not important, the corner posts can be entirely omitted.

In an alternative design shown in FIG. 16, the four corner covers or couplers 60-66 and the four corner support posts 58 can be omitted simply by extending each of the four segments of the flexible side walls 24 so that they abut at the four corners of the diffuser. This simplified design may produce more leakage of process gas at the corners, but in many applications the amount of leakage may be so small as to not significantly affect the plasma process being performed on the workpiece.

In a chamber intended to process a circular workpiece 14 such as a silicon wafer, the diffuser 20 preferably should be circular in cross section, rather than rectangular as in the preceding examples. In that case, the flexible suspension or side wall 24 of the gas inlet manifold could be a single, unbroken piece having an annular shape. Alternatively, the flexibility of the suspension could be increased by dividing it into any number of axially extending segments separated by small axially extending gaps, similar to the four segments of the rectangular side wall in the previously discussed embodiments.

While thermal expansion of the diffuser is not a severe problem in the chambers most commonly used today for processing 200 mm diameter silicon wafers, thermal expansion will become more significant as the industry moves to larger diameter wafers, and hence larger diameter diffusers. Therefore, this is an important prospective application of the invention.

Thermal Isolation of Gas Distribution Plate

In many semiconductor fabrication processes commonly performed in a plasma chamber, it is necessary to maintain the substrate 14 at an elevated temperature. Generally this is accomplished by an electric heater mounted within the substrate support pedestal 12. The temperature must be spatially uniform across the entire exposed (front) surface of the substrate in order to achieve good spatial uniformity of the fabrication process being performed on the substrate.

When the substrate has low thermal conductivity, as is true for the glass substrates used for fabricating flat panel displays, spatial uniformity of substrate surface temperate is harder to achieve. Typically there is a 50° to 75° C. temperature drop from the pedestal to the front surface of the substrate. Consequently, the substrate surface temperature is not determined solely by the pedestal temperature, but is strongly influenced by the temperatures of nearby chamber components.

In typical plasma chambers, the diffuser or gas distribution plate 20 is by far the chamber component closest to the substrate surface (other than the pedestal), so it has by far the greatest effect on the substrate temperature. Attaining high spatial uniformity of the temperature of the diffuser is important to attain high spatial uniformity of the substrate surface temperature.

The temperature of the diffuser is determined by the balance between: (a) heat transferred to the diffuser from the plasma and black body radiation from the heated substrate, and (b) heat conducted from the diffuser to the chamber wall 10. In conventional designs, the diffuser commonly is 100° C. cooler at its perimeter than its center because the perimeter of the gas distribution plate is bolted directly to a chamber lid or side wall that has high thermal mass and high thermal conductivity, so that the lid or side wall functions as a heat sink drawing heat away from the perimeter of the distribution plate. The relatively cool perimeter of the diffuser reduces the temperature of the perimeter of the substrate surface, thereby degrading the spacial uniformity of the temperature of the substrate surface.

In contrast, our novel gas inlet manifold can thermally isolate the gas distribution plate by providing thermal resistance between the gas distribution plate and the other chamber components to which it is mounted, such as the lid 18 and chamber wall 10. One advantage of this thermal isolation is that it reduces heat loss from the perimeter of the diffuser, and thereby reduces the temperature differential between the center and perimeter of the diffuser.

Another advantage of the thermal isolation afforded by the invention is that it enables the diffuser or gas distribution plate 20 to operate at a higher temperature than conventional designs. A higher temperature diffuser reduces heat loss from the substrate, thereby reducing the temperature difference between the substrate surface and the substrate support pedestal. Consequently, for a given pedestal temperature the semiconductor fabrication process can be performed at a higher substrate surface temperature, or, conversely, for a given substrate surface temperature required by a process, the pedestal can be operated at a lower temperature, which can extend the life of the pedestal.

Also, if it is desired to use a conventional in situ plasma process for cleaning residue from the interior of the chamber, the cleaning of the gas distribution plate is accelerated if the temperature of the gas distribution plate is elevated.

To achieve the desired thermal isolation of the gas distribution plate 20, our inlet manifold side wall 24 (or a portion thereof) is sufficiently thin, and has sufficient length or height, so that the thermal resistance of the side wall 24 (or such portion) is large enough to provide a substantial temperature difference between the gas distribution plate and the chamber components to which it is mounted, i.e., the inlet manifold top wall or back wall 28, the chamber lid 18, the chamber side wall 10, and the O-rings 45–47. By length or height we mean a dimension along the direction perpendicular to the plane of the gas distribution plate. In the successfully tested embodiment of FIG. 1, the inlet manifold side wall is sheet aluminum having a thickness of 1 mm and a height of 5 cm.

Our preferred temperature for the gas distribution plate 20 while performing a plasma CVD process is at least 200° C., preferably 250° to 400° C., and most preferably 300° to 325° C. Our inlet manifold side wall 24 has sufficient thermal resistance to allow the gas distribution plate to reach such temperatures while the outer chamber components do not exceed 100° to 140° C. The chamber wall 10, lid 18, and inlet manifold top wall or back wall 28 can be considered to function as heat sinks to maintain the O-rings 45–48 at a sufficiently low temperature.

If the temperature is 300° C. at the gas distribution plate 20 during plasma processing and is 140° C. at the inlet manifold back wall 28 and O-rings 45–48, then the temperature differential across the inlet manifold side wall 24 is about 160° C. Our invention contemplates that the side wall thickness and height preferably should be sufficiently small and large, respectively, so that such temperature differential is at least 100° C. after the chamber components reach their normal operating temperatures during plasma processing.

We compared a plasma chamber using the suspended inlet manifold design of FIGS. 1–11 with an otherwise identical conventional chamber in which the diffuser or gas distribution plate 20 is bolted directly to the inlet manifold top wall or back wall 28. In both chambers an electrical heater within the substrate support pedestal maintained the pedestal at 400° C. The top wall or back wall 28 of the inlet manifold, the chamber lid 18, and the chamber walls 10 were cooled by water maintained at 85° C. In the conventional chamber, the diffuser temperature ranged from 250° C. to 150° C. at the center and perimeter, respectively, a 100° C. spatial variation. In the chamber employing the suspended inlet manifold according to our invention, the diffuser temperature was 325° and 315° C. at the center and perimeter, respectively, a spatial variation of only 10° C. Therefore, the invention improved the spatial uniformity of the diffuser temperature by a factor of ten.

(Although we achieved spatial variation of only 10° C., a suspended inlet manifold would be within the scope of the invention if its thermal impedance is sufficient to achieve a spatial variation no greater than 50° C., or preferably no greater than 20° C.)

Furthermore, the surface temperature at the center of the substrate surface was 70° C. cooler than the heated pedestal in the conventional chamber, but only 25° C. cooler than the pedestal in the chamber using our invention. Therefore, the invention achieved a substrate surface temperature 45° C. higher for a given pedestal temperature, or, conversely, would allow the pedestal to be operated at a temperature 45° C. cooler to achieve a given substrate surface temperature.

(Although we achieved a temperature differential of only 25° C. between the heated pedestal and the center of the substrate surface, a suspended inlet manifold would be within the scope of the invention if its thermal impedance is sufficient to achieve such a differential no greater than 50° C., or preferably no greater than 35° C.)

The thermal isolation between the diffuser and the back wall of the gas inlet manifold cannot be decreased completely to zero by further increasing the thermal resistance of the side wall. In addition to heat conduction through the side wall, heat will be transferred by radiation from the diffuser to the back wall. If the thermal resistance of the side wall is high enough that the heat transfer by conduction is much less than the heat transfer by radiation, any further increase in the thermal resistance will provide little benefit because the heat transfer by radiation will dominate.

To ensure a reliable vacuum seal between the chamber interior and the external atmosphere, it is important to protect the O-rings 45–48 from excessive temperature. Low cost O-rings (e.g., composed of Viton elastomer) typically are rated by their manufacturers at 250° C. or less, and some experts believe such O-rings should be maintained at or below 100° C. to maximize their reliability.

The O-rings 46 and 48 directly contact the chamber lid 18, and O-ring 47 directly contacts the back wall 28 of the gas inlet manifold, hence the temperatures of these O-rings are expected to be about the same as the respective temperatures of the lid and back wall. In the first embodiment, the O-ring 45 directly contacts the back wall, whereas in the second embodiment (FIGS. 12–14) the O-ring 45 directly contacts the reinforcing flange 70 of the suspension 24. Because the reinforcing flange preferably is mounted in good thermal contact with the back wall, the O-ring 45 in this embodiment is expected to be only slightly hotter than the other O-rings.

We find that simple exposure to the ambient atmosphere suffices to maintain the lid 18 and chamber wall 10 at temperatures of 100° to 140° C. The inlet manifold back wall 28 generally is cooler because it has no direct exposure to heat radiation from the plasma within the chamber. Therefore, we expect the temperatures of the O-rings 45–48 will not exceed 140° C. This temperature is low enough that we do not believe any additional cooling, such as water cooling, is required.

Optionally, however, the chamber side wall 10 can be further cooled by surrounding it with a water jacket, not shown, through which cool water can be pumped. Similarly, the cover 16, lid 18, and inlet manifold back wall 28 can be cooled by pumping the same water through a sealed water jacket (not shown) mounted on the upper surface of the inlet manifold back wall 28, below the cover 16. Such water cooling can prevent the temperatures of the O-rings 45–48 from exceeding 100° C.

Since the top wall or back wall 28 of the gas inlet manifold is RF powered, a dielectric should be interposed between the water jacket and the back wall. A thicker dielectric can be selected if it is desired to increase the temperature differential between the water jacket and the back wall. This may be useful in applications in which it is desired to maintain the back wall at a temperature substantially higher than the temperature of the water, such as a temperature over 100° C. Maintaining the back wall at such a high temperature would help elevate the temperature of the gas distribution plate, which can be advantageous for reasons explained in the next paragraph.

Thermal Isolation Without Flexible Suspension

The preceding section of this patent specification describes the benefits of thermal isolation between the diffuser or gas distribution plate 20 and the chamber components to which the diffuser is attached. As stated above, such thermal isolation is attained if the side wall 24 of the inlet manifold has sufficient thinness and height to interpose substantial thermal impedance between the diffuser and the chamber component to which the upper end of the side wall 24 is mounted.

In addition, the inlet manifold side wall 24 preferably is flexible in order to avoid stress in the diffuser due to differential thermal expansion between the diffuser and the side wall, as also described above. While preferable, such flexibility is not essential to achieve the thermal isolation benefits of the inlet manifold side wall. For example, to further increase the thermal isolation, it may be desirable to fabricate the side wall 24 of a material having much lower thermal conductivity than the aluminum used in the previously described embodiments. Some such materials may be too stiff or brittle to be flexible.

If the side wall 24 is not flexible, then some other means should be used to avoid mechanical stress in the diffuser due to differential thermal expansion between the diffuser and the side wall. One solution, shown in FIG. 17, is to enlarge the holes 80, 81 in the lower flange 54 so as to permit the differential movement between the diffuser and the side wall that was provided by the flexibility of the side wall in the preceding embodiments. In particular, the holes 81 that were elongated in the flexible side wall embodiments should be circular when the side wall is non-flexible because the diffuser will thermally expand in both orthogonal directions in the plane of the diffuser.

The diameter of each circular hole 81 should be at least as great as the long axis of the corresponding elongated holes in the preceding embodiments. Specifically, the sliding distance of each pin 82 in its corresponding hole 81 should be equal to or greater than the maximum expected difference between the expansion of the side wall segment and the expansion of the diffuser in response to temperature gradients during operation of the chamber. The diameter of the hole 81 should be such sliding distance plus the diameter of the pin 82.

The holes 80 at the center of each lower flange 54 preferably should be dimensioned to permit the lower flange to move in a direction perpendicular to the side wall 24, but to maintain the centering of the diffuser by preventing movement of the lower flange in a direction parallel to the long dimension of the lower flange. This can be accomplished if the holes 80 are elongated, with their short and long axes respectively perpendicular and parallel to the long dimension of the lower flange, as shown in FIG. 15. The long axis of each centrally located hole 80 should be dimensioned according to the same criteria as the diameter of the circular holes 81 as just discussed.

The short axis of each elongated hole 80 only needs to exceed the diameter of the mating pin 82 by a slight amount sufficient to prevent the pin from binding in the hole, so that the lower flange 54 will be free to slide along the long axis without binding. This slight difference in dimensions can be substantially less than the sliding distance along the long axis that was discussed in the preceding paragraphs. For example, if each pin 82 has a diameter of 0.1 inch, the short axis of each elongated hole 81 can be 0.11 inch.

What is claimed is:

1. A method of minimizing thermal stress on a gas distribution plate through which gas is dispensed into the interior of a plasma chamber, comprising the steps of:

providing a plasma chamber having an interior;

mounting an inlet manifold top wall within the chamber;

providing one or more inlet manifold side wall segments, wherein each side wall segment includes an upper portion, a lower flange, and a sheet extending between the upper portion of that side wall segment and the lower flange of that side wall segment;

mounting the upper portion of each segment of the inlet manifold side wall to the inlet manifold top wall so as to position the segments of the inlet manifold side wall so that they collectively encircle an inlet manifold region within the plasma chamber;

providing a gas distribution plate perforated by a number of gas outlet orifices;

mounting the lower flange of each side wall segment to the gas distribution plate so that the gas distribution plate is spaced away from the inlet manifold top wall, wherein the inlet manifold top wall, the inlet manifold side wall segments, and the gas distribution plate collectively enclose said inlet manifold region; and supplying a gas through a gas inlet orifice in the inlet manifold top wall so that the gas flows into the inlet manifold region and then flows through the gas outlet orifices into the interior of the plasma chamber.

2. A method according to claim 1, further comprising the step of:

maintaining a plasma within the interior of the plasma chamber;

wherein the step of providing the inlet manifold side wall segments includes the step of providing each sheet with a thickness sufficiently small, and a height sufficiently large, so as to produce a substantial temperature differential between the inlet manifold top wall and the gas distribution plate in response to heat transferred from the plasma to the gas distribution plate.

3. A method according to claim 1, further comprising the step of:

maintaining a plasma within the interior of the plasma chamber;

wherein the step of providing the inlet manifold side wall segments includes the step of providing each sheet with a thickness sufficiently small, and a height sufficiently large, so as to produce a temperature differential of at least 100 degrees C. between the inlet manifold top wall and the gas distribution plate in response to heat transferred from the plasma to the gas distribution plate.

4. A method according to claim 1, wherein the step of providing the inlet manifold side wall segments includes the step of:

providing each sheet with a flexibility sufficient so that no substantial force is required to bend the sheet by an amount sufficient to permit the gas distribution plate to expand by at least one percent.

5. A method according to claim 1, wherein:

the inlet manifold top wall has a surface facing the gas distribution plate that is generally rectangular with four sides;

the gas distribution plate has a surface facing the top wall that is generally rectangular with four sides;

the step of providing the inlet manifold side wall segments comprises providing four of said side wall segments wherein the sheet of each of the four side wall segments is generally rectangular; and the step of mounting the lower flange of each side wall segment comprises mounting each flange so that the sheet of each of the four side wall segments extends between a corresponding one of the four sides of said surface of the top wall and a corresponding one of the four sides of said surface of the gas distribution plate.

6. A method according to claim 1, wherein:

the gas distribution plate has one or more grooves in its perimeter; and the step of mounting the lower flange of each side wall segment comprises mounting each such flange so as to extend into one of said grooves.

7. A method according to claim 1, wherein:

the gas distribution plate further comprises
a lip extending radially outward from the perimeter of the gas distribution plate, and
a plurality of pins attached to, and extending downward from, the lip of the gas distribution plate;

the lower flange of each side wall segment is perforated by a plurality of holes;

the step of mounting the lower flange of each side wall segment comprises mounting each flange to the gas distribution plate so that each of said pins extends through a corresponding one of said holes; and each hole has a width that exceeds the width of its corresponding pin so as to permit relative movement between each lower flange and the gas distribution plate.

8. A method according to claim 7, wherein:

the sheet of each side wall segment is flexible so as to permit movement of the lower flange of that side wall segment in a direction perpendicular to the sheet; and for each side wall segment, each hole in the lower flange of that side wall segment has a long axis parallel to the sheet of that side wall segment.

9. A method according to claim 7, wherein:

the width of each hole along one axis of the hole exceeds the width of its corresponding pin along said axis by an amount sufficient to permit an amount of relative movement between each lower flange and the gas distribution plate that exceeds the maximum likely relative differential thermal expansion between the lower flange and the gas distribution plate during operation of the plasma chamber.

10. A method according to claim 7, wherein:

the width of each hole along one axis of the hole exceeds the width of its corresponding pin along said axis by at least 0.03 inch.

11. A method according to claim 7, wherein:

the width of each hole along one axis of the hole exceeds the width of its corresponding pin along said axis by at least 0.1% of the widest dimension of the gas distribution plate.

12. A method according to claim 1, wherein:

said one or more side wall segments include first and second side wall segments; and the method further comprises the steps of:
positioning an edge of the sheet of the first side wall segment and an edge of the sheet of the second side wall segment so as to be adjacent, parallel, and separated by a gap; and
mounting a post radially outward of the gap and sufficiently close to the gap so as to impede the flow of gas through the gap.

13. A method according to claim 1, wherein:

the step of providing one or more side wall segments includes providing first and second side wall segments;

the sheet of the first side wall segment is bent at a first angle along a first vertical vertex line so that: (i) a first end area of the sheet extends between the first vertex line and an edge of the sheet, and (ii) a first central area of the sheet lies on the opposite side of the first vertex line;

the sheet of the second side wall segment is bent at a second angle along a second vertical vertex line so that: (i) a second end area of the sheet extends between the second vertex line and an edge of the sheet, and (ii) a second central area of the sheet lies on the opposite side of the second vertex line;

the method further comprises the step of positioning said edge of the sheet of the first side wall segment and said edge of the sheet of the second side wall segment so as to be adjacent, parallel and separated by a gap; and the first and second angles are established so that the first and second end areas are coplanar and are separated only by said gap.

14. A method according to claim 13, wherein both the first angle and the second angle are 45 degrees.

15. A method according to claim 13, further comprising the step of mounting a post radially outward of the gap, wherein:
- the post extends vertically along the entire length of the gap;
- the post extends laterally so as to overlie the first end area, the second end area, a portion of the first central area adjoining the first vertex line, and a portion of the second central area adjoining the second vertex line; and
- the post is positioned sufficiently close to said portions of the first and second areas, and said portions of the first and second areas are sufficiently large, so that the post impedes gas within the inlet manifold from flowing through the gap.

16. A method of minimizing spatial variation in temperature of a gas distribution plate through which gas is dispensed into the interior of a plasma chamber, comprising the steps of:
- providing a plasma chamber having an interior;
- mounting an inlet manifold top wall within the chamber;
- providing an inlet manifold side wall including one or more side wall segments, wherein each side wall segment includes an upper portion, a lower flange, and a sheet extending between the upper portion of that side wall segment and the lower flange of that side wall segment;
- mounting the upper portion of each side wall segment to the inlet manifold top wall so as to position the side wall segments so that they collectively encircle an inlet manifold region within the plasma chamber;
- providing a gas distribution plate perforated by a number of gas outlet orifices;
- mounting the lower flange of each side wall segment to the gas distribution plate so that the gas distribution plate is spaced away from the top wall, wherein the inlet manifold top wall, the inlet manifold side wall segments, and the gas distribution plate collectively enclose said inlet manifold region; and
- supplying a gas through a gas inlet orifice in the inlet manifold top wall so that the gas flows into the inlet manifold region and then flows through the gas outlet orifices into the interior of the plasma chamber; and
- providing a plasma within the chamber;
- wherein the inlet manifold side wall interposes a sufficiently high thermal resistance between the inlet manifold top wall and the gas distribution plate so that, during operation of the plasma chamber, the gas distribution plate has a spatial variation in temperature no greater than 50 degrees C.

17. A method according to claim 16, wherein said spatial variation in temperature is no greater than 10 degrees C.

18. A method of minimizing the difference in temperature between a workpiece support pedestal and a gas distribution plate through which gas is dispensed into the interior of a plasma chamber, comprising the steps of:
- supporting a substrate on a pedestal within the plasma chamber;
- heating the pedestal;
- mounting an inlet manifold top wall within the chamber;
- providing an inlet manifold side wall including one or more side wall segments, wherein each side wall segment includes an upper portion, a lower flange, and a sheet extending between the upper portion of that side wall segment and the lower flange of that side wall segment;
- mounting the upper portion of each side wall segment to the inlet manifold top wall so as to position the side wall segments so that they collectively encircle an inlet manifold region within the plasma chamber;
- providing a gas distribution plate perforated by a number of gas outlet orifices;
- mounting the lower flange of each side wall segment to the gas distribution plate so that the gas distribution plate is spaced away from the top wall, wherein the inlet manifold top wall, the inlet manifold side wall segments, and the gas distribution plate collectively enclose said inlet manifold region; and
- supplying a gas through a gas inlet orifice in the inlet manifold top wall so that the gas flows into the inlet manifold region and then flows through the gas outlet orifices into the interior of the plasma chamber; and
- providing a plasma within the chamber;
- wherein the inlet manifold side wall interposes a sufficiently high thermal resistance between the inlet manifold top wall and the gas distribution plate so that, during the steps of heating the pedestal and providing a plasma within the chamber, there is a temperature difference between the pedestal and the upper surface of the substrate no greater than 50 degrees C.

19. A method according to claim 18, wherein said temperature difference is no greater than 25 degrees C.

20. A method according to claim 1, wherein the step of providing the inlet manifold side wall segments includes the step of:
- providing each sheet with a thickness less than 3 millimeters.

21. A method according to claim 1, wherein the step of providing the inlet manifold side wall segments includes the step of:
- providing each sheet with a thickness less than 1 millimeter.

22. A method according to claim 1, wherein the step of providing the inlet manifold side wall segments includes the step of:
- providing each sheet with a flexibility sufficient to permit each sheet to bend at least 6.3 degrees.

23. A method according to claim 1, further comprising the steps of:
- positioning a workpiece within the interior of the plasma chamber; and
- maintaining a plasma within the interior of the plasma chamber;
- wherein the step of providing the gas distribution plate includes the step of providing the gas distribution plate with a surface facing the workpiece; and
- wherein the step of providing the inlet manifold side wall segments includes the step of providing each sheet with a flexibility sufficient so as to prevent the flatness of said surface of the gas distribution plate from being distorted by more than 25 microns in response to heat from the plasma.

24. A method according to claim 1, further comprising the steps of:
- positioning a workpiece within the interior of the plasma chamber; and
- maintaining a plasma within the interior of the plasma chamber;
- wherein the step of providing the gas distribution plate includes the step of providing the gas distribution plate with a surface facing the workpiece; and wherein the step of providing the inlet manifold side wall segments includes the step of providing each sheet with a flexibility sufficient so as to prevent the flatness of said surface of the gas distribution plate from being distorted by more than 10 microns in response to heat from the plasma.

* * * * *